United States Patent
Matsumura

(10) Patent No.: US 8,659,122 B2
(45) Date of Patent: Feb. 25, 2014

(54) SEMICONDUCTOR DEVICE AND MANUFACTURING METHOD THEREOF

(75) Inventor: Akira Matsumura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 59 days.

(21) Appl. No.: 13/016,276

(22) Filed: Jan. 28, 2011

(65) Prior Publication Data

US 2011/0180901 A1 Jul. 28, 2011

(30) Foreign Application Priority Data

Jan. 28, 2010 (JP) ................ 2010-016732

(51) Int. Cl.
*H01L 29/00* (2006.01)
*H01L 27/06* (2006.01)
*H01L 21/20* (2006.01)

(52) U.S. Cl.
USPC ............... 257/536; 257/533; 257/E29.325; 438/382; 438/384

(58) Field of Classification Search
USPC .......... 257/536, 516, 533, E27.047, E27.071, 257/E23.044; 438/382, 384
See application file for complete search history.

(56) References Cited

U.S. PATENT DOCUMENTS

| | | | |
|---|---|---|---|
| 6,060,760 A | 5/2000 | Tan | |
| 6,462,268 B1 | 10/2002 | Hazy et al. | |
| 7,298,020 B2 | 11/2007 | Asano et al. | |
| 2004/0056326 A1 | 3/2004 | Beach et al. | |
| 2004/0227237 A1 | 11/2004 | Ueda | |
| 2005/0260822 A1* | 11/2005 | Keum et al. ............ | 438/382 |
| 2006/0049525 A1* | 3/2006 | Lin et al. ............ | 257/758 |
| 2006/0228879 A1 | 10/2006 | Beach et al. | |
| 2006/0238292 A1* | 10/2006 | Beach et al. ............ | 338/309 |
| 2007/0063813 A1* | 3/2007 | McGuinness et al. ...... | 338/195 |
| 2008/0237799 A1 | 10/2008 | Yamashita | |
| 2009/0015369 A1* | 1/2009 | Takeda et al. ............ | 338/307 |
| 2009/0023263 A1* | 1/2009 | Phan et al. ............ | 438/384 |
| 2009/0206982 A1 | 8/2009 | Deiters et al. | |
| 2009/0302993 A1* | 12/2009 | Fujiwara et al. ............ | 338/314 |
| 2010/0321095 A1 | 12/2010 | Mikawa et al. | |

FOREIGN PATENT DOCUMENTS

| | | |
|---|---|---|
| JP | 62-032637 | 2/1987 |
| JP | 09-064699 | 3/1997 |
| JP | 11-017113 | 1/1999 |

(Continued)

OTHER PUBLICATIONS

Stine et al., (1998), "The physical and electrical effects of metal-fill patterning practices for oxide chemical-mechanical polishing processes", *IEEE T Electron Dev*, 45(3):665-679.

(Continued)

*Primary Examiner* — Daniel Luke
*Assistant Examiner* — Khaja Ahmad
(74) *Attorney, Agent, or Firm* — McDermott Will & Emery LLP

(57) ABSTRACT

To provide a semiconductor device having a structure free from variations in resistance even when a stress is applied thereto; and a manufacturing method of the device. The semiconductor device has a metal resistor layer in a region between a passivation film and an uppermost level aluminum interconnect. This makes it possible to realize a high-precision resistor having few variations in resistance due to a mold stress that occurs in a packaging step or thereafter and therefore, makes it possible to form a high-precision analog circuit.

7 Claims, 43 Drawing Sheets

(56) References Cited

FOREIGN PATENT DOCUMENTS

| | | |
|---|---|---|
| JP | 2004-281966 A | 10/2004 |
| JP | 2004-304068 A | 10/2004 |
| JP | 2006-332428 A | 12/2006 |
| JP | 2008-251616 | 10/2008 |
| JP | 2009-021509 | 1/2009 |
| JP | 2009-188020 A | 8/2009 |
| WO | 2009/150814 A1 | 12/2009 |

OTHER PUBLICATIONS

Extended European Search Report issued in European Patent Application No. 10252262.0, dated Aug. 8, 2011.
Japanese Notification of Reasons for Refusal, w/ English translation thereof, issued in Japanese Patent Application No. JP 2010-016732 dated Oct. 15, 2013.

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2010-16732 filed on Jan. 28, 2010 including the specification, drawings and abstract is incorporated herein by reference in its entirety.

BACKGROUND OF THE INVENTION

The present invention relates to a semiconductor device and a manufacturing method thereof, particularly to a semiconductor device having a metal resistor layer and a manufacturing method of the device.

Microcomputer products and oscillators have conventionally been provided as separate structures. In recent years, oscillators have been integrated in microcomputer chips for the purpose of narrowing a layout area, reducing a production cost, or the like. To achieve integration of oscillators in microcomputer chips, stable output of an oscillation frequency under any environment (voltage/temperature) is necessary. High-speed OCO (on chip oscillator) circuits of microcomputer products are therefore required to achieve, for example, 40 MHz±1% as target accuracy.

As a resistor of a constant current generator circuit in the high-speed OCO (on chip oscillator) circuit which is an analog circuit, a polysilicon resistor is used. Due to a so-called piezoresistive effect, however, the resistance of the polysilicon resistor varies depending on a stress. In particular, resistance varies remarkably depending on a mold stress in and after a packaging step. The frequency of the high-speed OCO circuit therefore varies greatly and as a result, it may be difficult to achieve the target accuracy of the high-speed OCO circuit.

As a prior art document, Patent Document 1 discloses an oscillator circuit capable of narrowing a layout area, reducing dependency on a power supply voltage, and reducing a rise time at the time of startup. This circuit is realized by a constant current circuit using a low-resistance resistor.

As another prior art document, Patent Document 2 discloses a semiconductor integrated circuit having a structure not causing a variation in the set value of a detection voltage even when resistance changes due to a piezoresistive effect which occurs depending on a mold stress unevenly distributed on the chip.

As a further prior document, Patent Document 3 discloses a semiconductor device having a configuration capable of, upon exposure in photolithography to define the formation position of a metal resistor, preventing generation of a standing wave in the resist film and thereby reducing the dimensional variation of the metal resistor.

As a still further prior document, Patent Document 4 discloses a semiconductor device with a resistor featuring a low parasitic capacitance and small variations of resistance due to heat treatment.

[Patent Document 1] Japanese Patent Laid-Open No. 64699/1997
[Patent Document 2] Japanese Patent Laid-Open No. 17113/1999
[Patent Document 3] Japanese Patent Laid-Open No. 2008-251616
[Patent Document 4] Japanese Patent Laid-Open No. 2009-021509

SUMMARY OF THE INVENTION

The problem that the invention is to solve resides in that when a polysilicon resistor is used in a circuit in a semiconductor device, the resistance of the polysilicon resistor varies due to an applied stress, which is a so-called piezoresistive effect. An object of the present invention is therefore to provide a semiconductor device equipped with a structure free from variations in resistance even when a stress is applied; and a manufacturing method of the semiconductor device.

The semiconductor device according to one example of the invention has the following configuration. It has a first interlayer insulating film and a plurality of first dummy layers provided over the first interlayer insulating film, arranged to have a predetermined space between any adjacent two thereof in a first direction, and extending in a second direction perpendicular to the first direction. It also has a second interlayer insulating film covering therewith the first dummy layers and having a planarized surface. It further has a metal resistor layer provided over the second interlayer insulating film and extending in the first direction (X).

The present example enables to provide a semiconductor device free from variations in resistance even when a stress is applied; and a manufacturing method of the device.

BRIEF DESCRIPTION OF THE DRAWINGS

FIGS. 42A and 42B are schematic views illustrating a wiring pattern of metal resistor layers of the semiconductor device of each Embodiment of the invention, in which FIG. 42A is a plan view of the wiring pattern of metal resistor layers and FIG. 42B is a view illustrating the flow of an electric current; and FIGS. 43A and 43B are schematic views illustrating another wiring pattern of metal resistor layers of the semiconductor device of each Embodiment of the invention, in which FIG. 43A is a plan view of the wiring pattern of metal resistor layers and FIG. 43B is a view illustrating the flow of an electric current.

DETAILED DESCRIPTION OF THE INVENTION

Figure 1:
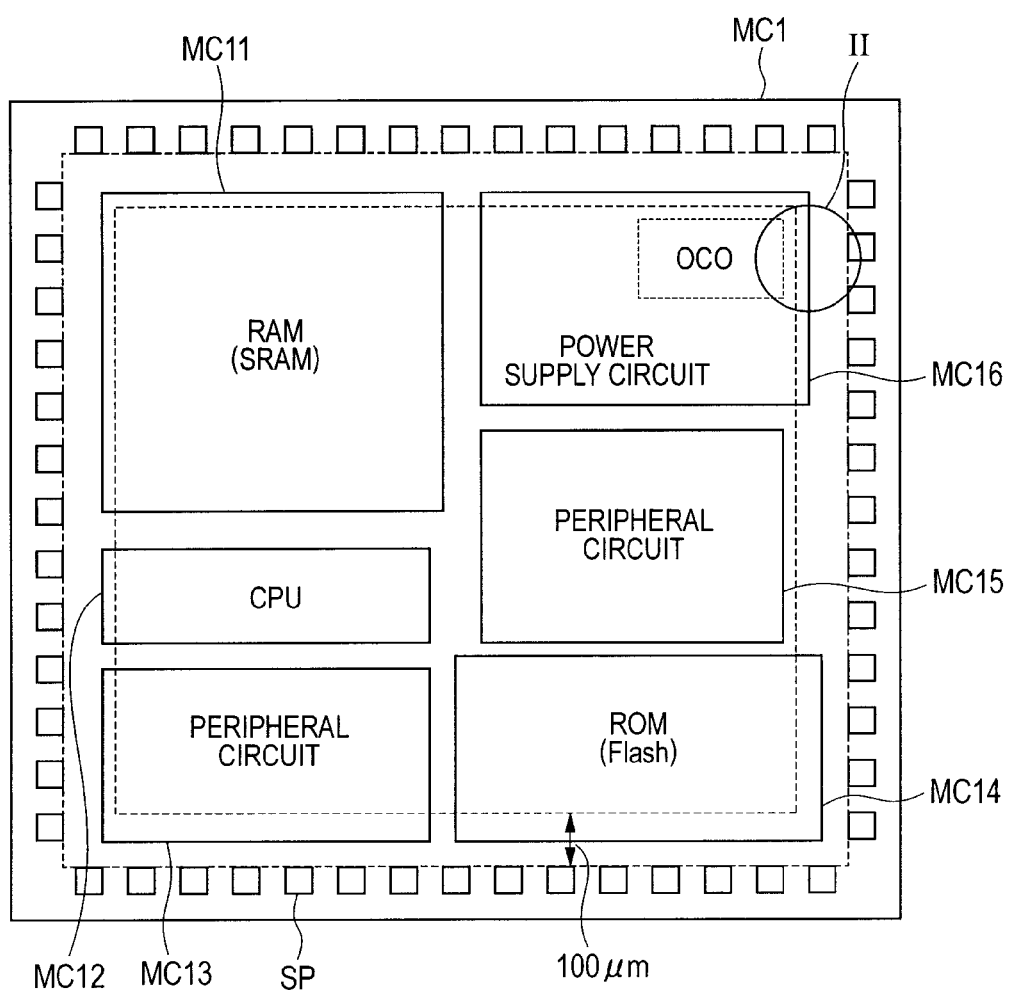
FIG. 1 is a plan view illustrating the entire structure of a microcomputer chip having thereon a semiconductor device of Embodiment 1 of the invention.

The semiconductor device according to each embodiment based on the invention will next be described referring to drawings. First, the entire structure of a microcomputer chip having thereon the semiconductor device of each Embodiment to be described below will next be described briefly referring to FIG. 1. Parts which are omitted in each drawing are indicated by a dotted line.

A microcomputer chip MC1 includes a RAM formation region MC11, a CPU formation region MC12, peripheral circuit formation regions MC13 and MC15, a ROM formation region MC14, and a power supply circuit region MC16. The power supply circuit region MC16 includes a high-speed OCO circuit. The present layout configuration is merely an example of the layout configuration of a microcomputer chip and the layout configuration of the microcomputer chip is not limited thereto.

Embodiment 1

Figure 2:
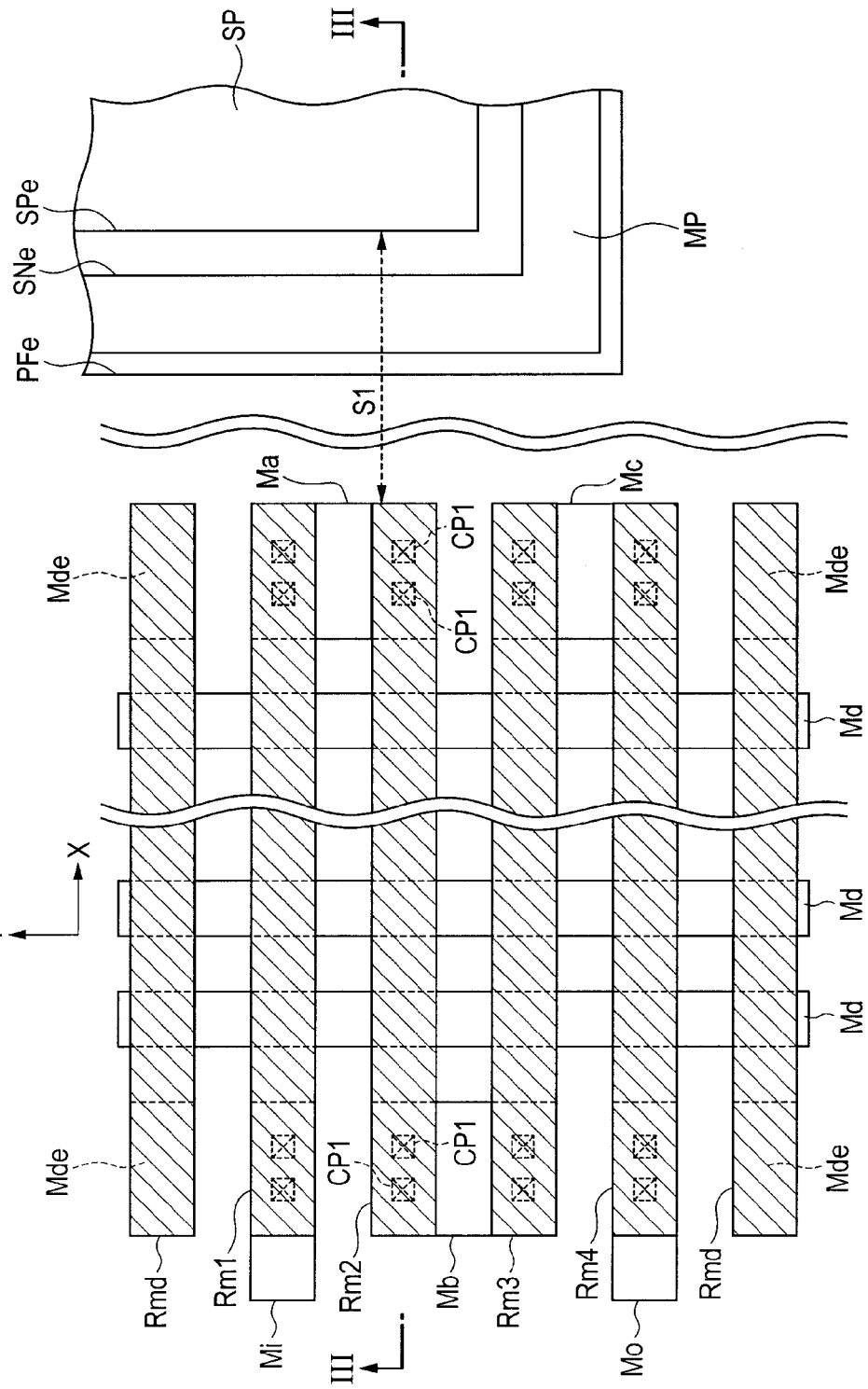
FIG. 2 is an enlarged plan view of a region surrounded with II in FIG. 1.
Figure 3:
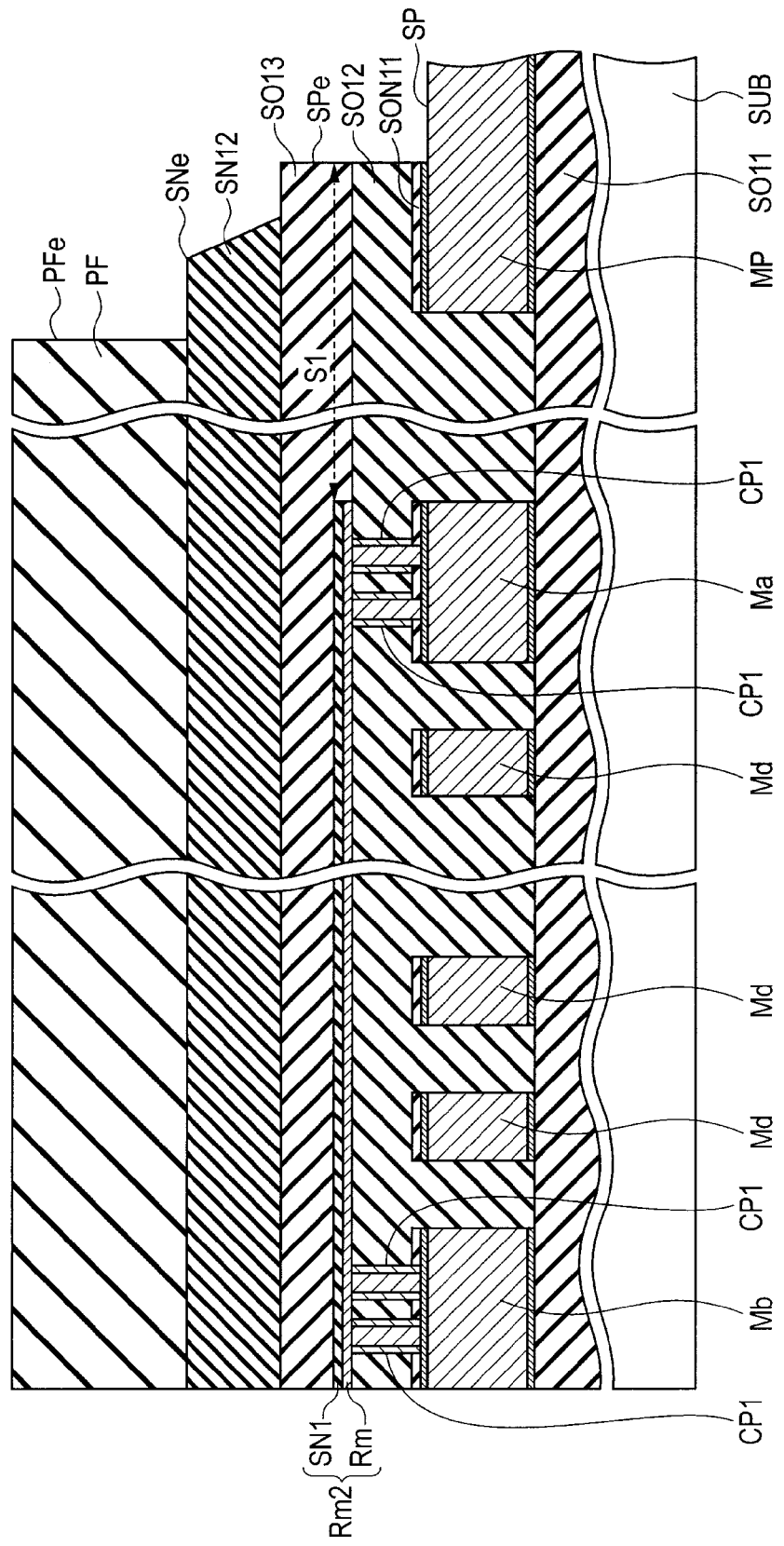
FIG. 3 is a cross-sectional view taken in the direction of arrows along the line III-III in FIG. 2.

Referring to FIGS. 2 and 3, a partial structure of a high-speed OCO circuit will next be described as one example of a semiconductor device. FIG. 3 illustrates the cross-section taken in the direction of arrows along the line III-III in FIG. 2.

As illustrated in FIG. 3, this semiconductor device has a first interlayer insulating film SO11 provided above a substrate SUB and a plurality of dummy layers Md provided over the first interlayer insulating film SO11, arranged to have a predetermined space between any adjacent two of the dummy layers in a first direction (direction X in FIG. 2), and extending in a second direction (direction Y in FIG. 2) perpendicular to the first direction (direction X).

The first interlayer insulating film SO11 has thereover tap layers Ma and Mb placed at positions sandwiching therewith the dummy layers Md from both sides thereof in the first direction (direction X) with a predetermined space in the second direction (direction Y). In the planar view illustrated in FIG. 2, tap layers Mi, Ma to Mc, and Mo are provided.

As illustrated in FIG. 3, the first interlayer insulating film SO11 has thereover a pad layer MP formed in the same step as that of forming the dummy layer MD and the tap layers Ma and Mb.

The plurality of the dummy layers Md and the tap layers Ma and Mb are covered with a second interlayer insulating film 5012 having a planarized surface. The second interlayer insulating film SO12 has thereover a metal resistor layer Rm2 extending in the first direction (direction X). The metal resistor layer Rm2 has a two-layer structure composed of a metal interconnect layer Rm and an antioxidant film layer SN1. The term "metal" as used herein embraces a transition metal and a metal other than the transition metal and at the same time, does not embrace a semi-metal, semiconductor, and nonmetal.

In the planar view illustrated in FIG. 2, metal resistor layers Rm1 to Rm4 extend in the first direction (direction X) and arranged to have a predetermined space between any adjacent two thereof in the second direction (direction Y). The metal resistor layers Rm1 to Rm4 each has, at both ends thereof, a contact plug CP1 penetrating through the second interlayer insulating film SO12 and linked to the tap layers Mi, Ma to Mb, and Mo.

From the viewpoint of improving the manufacturing precision in photolithography, the metal resistor layers Rm1 and Rm4 have, on the respective outsides thereof, a dummy metal resistor layer Rmd and a dummy tap layer Mde.

As a result, the metal resistor layers Rm1 to Rm4 are electrically coupled in series in the following manner: tap layer Mi→contact plug CP1→metal resistor layer Rm1→contact plug CP1→tap layer Ma→contact plug CP1→metal resistor layer Rm2→contact plug CP1→tap layer Mb→contact plug CP1→metal resistor layer Rm3→contact plug CP1→tap layer Mc→contact plug CP1→metal resistor layer Rm4→contact plug CP1→tap layer Mo.

As illustrated in FIG. 3, the metal resistor layer Rm2 is covered with a third interlayer insulating film SO13 having a flat surface and this third interlayer insulating film SO13 is covered with a passivation film SN12 having a flat surface, and the passivation film SN12 is covered with a protective film PF having a flat surface.

The second interlayer insulating film SO12, the third interlayer insulating film SO13, the passivation film SN12, and the protective film PF existing above the plurality of pad layers MP have an opening portion, by which a pad opening portion SP from which the surface of the pad layer MP is exposed is defined. The opening end face SPe of the second interlayer insulating film SO12 and the third interlayer insulating film SO13 is placed inside of an opening edge SNe of the passivation film SN12; and the opening edge SNe of the passivation film SN12 is placed inside of an opening end face PFe of the protective film PF.

A distance (S1) from the opening end face SPe of the second interlayer insulating film SO12 and the third interlayer insulating film SO13 to the metal resistor layers Rm1 to Rm4 is 100 μm or greater from the standpoint of preventing deterioration in humidity resistance of the metal resistor layers Rm1 to Rm4 which will otherwise occur due to penetration of water from the opening end face SPe.

Incidentally, the first interlayer insulating film SO11 has therebelow a known multilayer interconnect structure. (Manufacturing method) Next, referring to FIGS. 4 to 13, the manufacturing method of the semiconductor device illustrated in FIGS. 2 and 3 will be described. Each step of the manufacturing method described below corresponds to the cross-section taken in the direction of arrows along the line in FIGS. 2 and 3.

Figure 4:
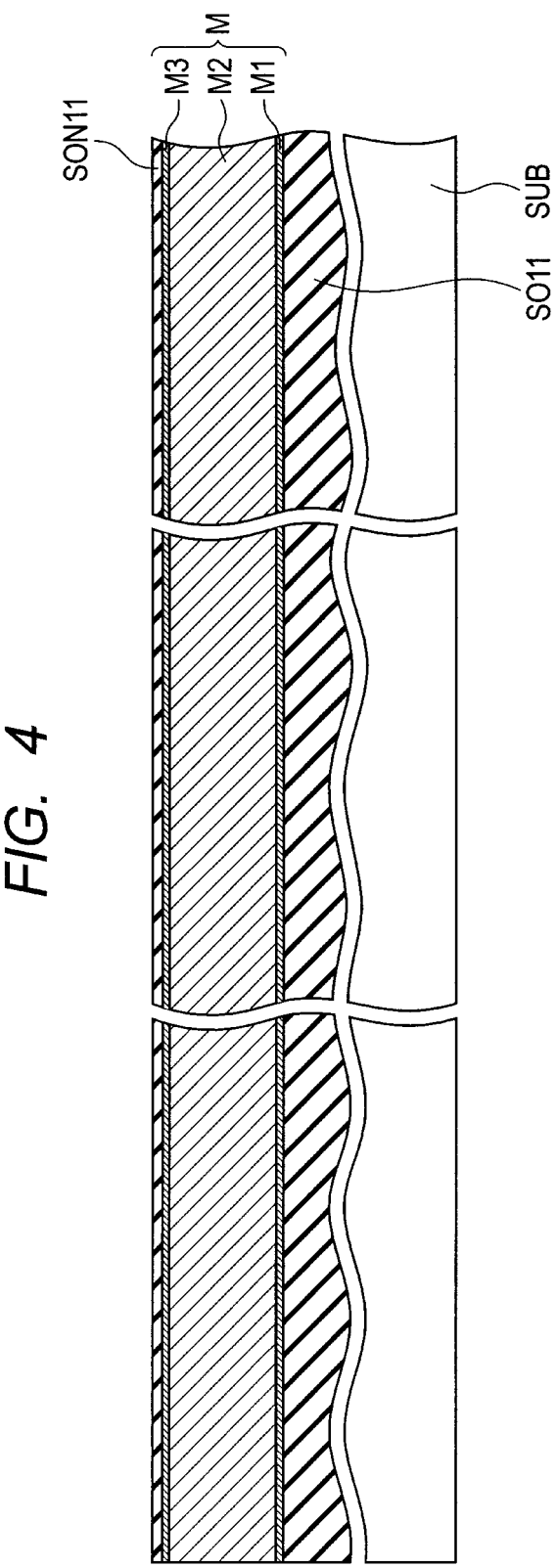
FIG. 4 is a schematic cross-sectional view illustrating a first step of a manufacturing method of the semiconductor device of Embodiment 1 of the invention.

As illustrated in FIG. 4, after formation of a known multilayer interconnect structure over a substrate SUB, a first interlayer insulating film SO11 having a planarized surface is formed. As the first interlayer insulating film SO11, a silicon oxide film is used. As the silicon oxide film, a USG (undoped silicate glass) film excellent in step-difference coverage and formed using high density plasma CVD and a TEOS film (P-TEOS) formed using plasma CVD are used. The substrate SUB may be a semiconductor substrate having a semiconductor element integrated therein or a substrate made of a material other than semiconductor.

Next, an interconnect layer M is formed over the first interlayer insulating film SO11. The interconnect layer M is an uppermost-level aluminum interconnect and is formed using sputtering. The interconnect layer M has a stack structure having a TiN/Ti film as a bottom layer M1, a copper-added aluminum (Al—Cu) film as an interconnect body M2, and a TiN/Ti film as a top layer M3. The interconnect layer M has a thickness of from about several hundred nm to 1 μm.

Next, an antireflective film SON11 is formed over the interconnect layer M. As the antireflective film SON11, a plasma oxynitride film (P-SiON) is formed using CVD.

Figure 5:
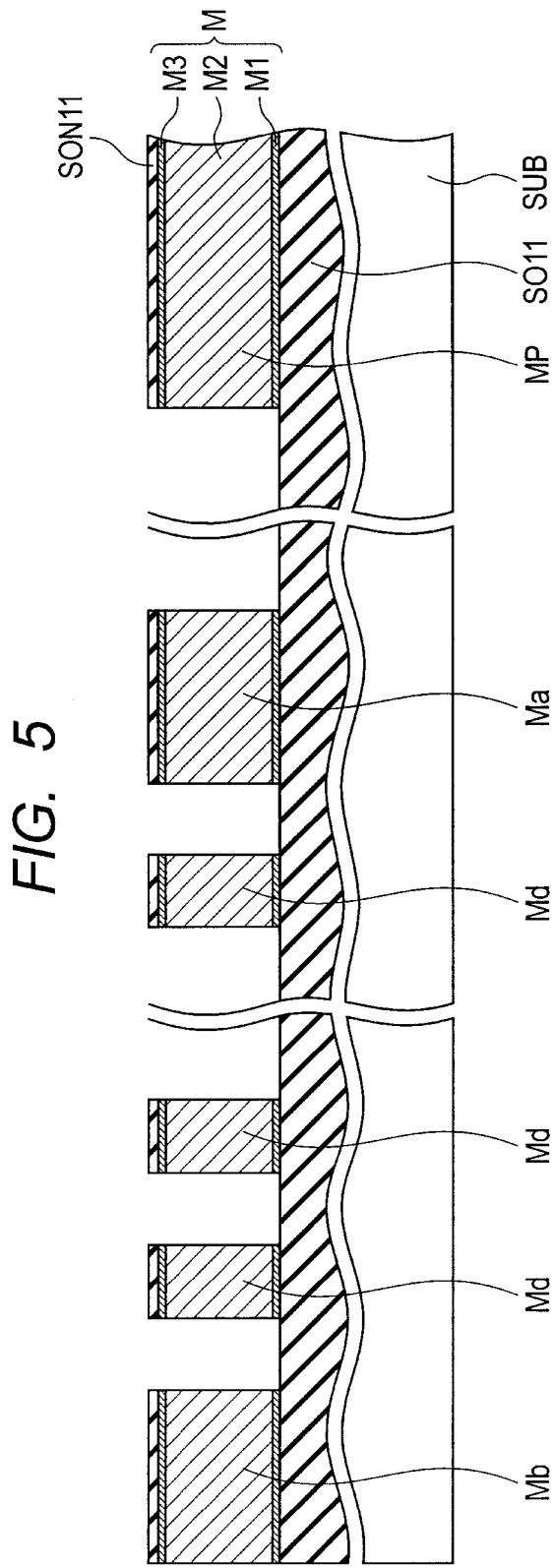
FIG. 5 is a schematic cross-sectional view illustrating a second step of the manufacturing method of the semiconductor device of Embodiment 1 of the invention.

Next, referring to FIG. 5, the interconnect layer M and the antireflective film SON11 are patterned. For the patterning, photolithography and dry etching are employed. They are patterned into a plurality of dummy layers Md arranged to have a predetermined space between any adjacent two thereof in the first direction (direction X) and extending in a second direction (direction Y) perpendicular to the first direction (direction X), tap layers Ma and Mb placed at a position sandwiching the dummy layers Md from both sides thereof in the first direction (direction X), and a pad region layer Mp.

Figure 6:
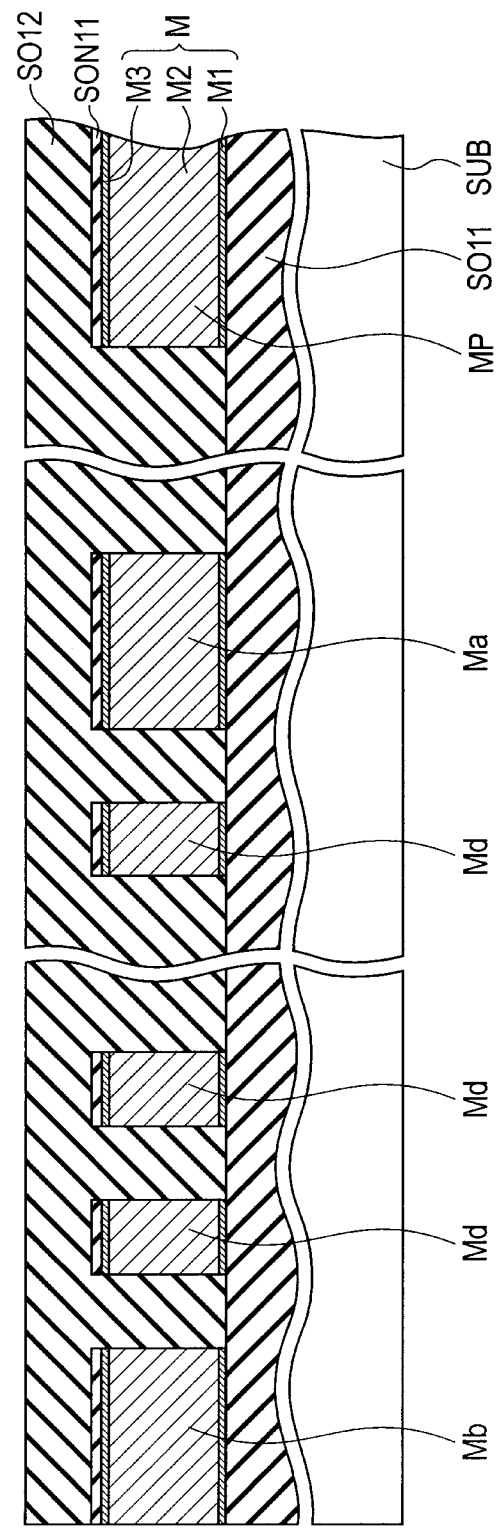
FIG. 6 is a schematic cross-sectional view illustrating a third step of the manufacturing method of the semiconductor device of Embodiment 1 of the invention.

Next, referring to FIG. 6, a second interlayer insulating film SO12 covering therewith the dummy layers Md, the tap layers Ma and Mb, and the pad region layer Mp are formed. As the second interlayer insulating film SO12, a silicon oxide film made of HDP-USG and P-TEOS is used. The surface of the silicon oxide film is planarized using CMP (chemical mechanical polishing).

The HDP-USG film is required to have a film thickness of 1 μm or greater in order to cover therewith a step difference of the aluminum interconnect. For planarization, a polishing amount about 1.5 times the step difference is necessary. The dummy layers Md are placed with an equal distance, for example, with a line width of about 3 μm and a space of about 3 μm to achieve good planarity of a metal resistor layer Rm to be formed later.

Figure 7:
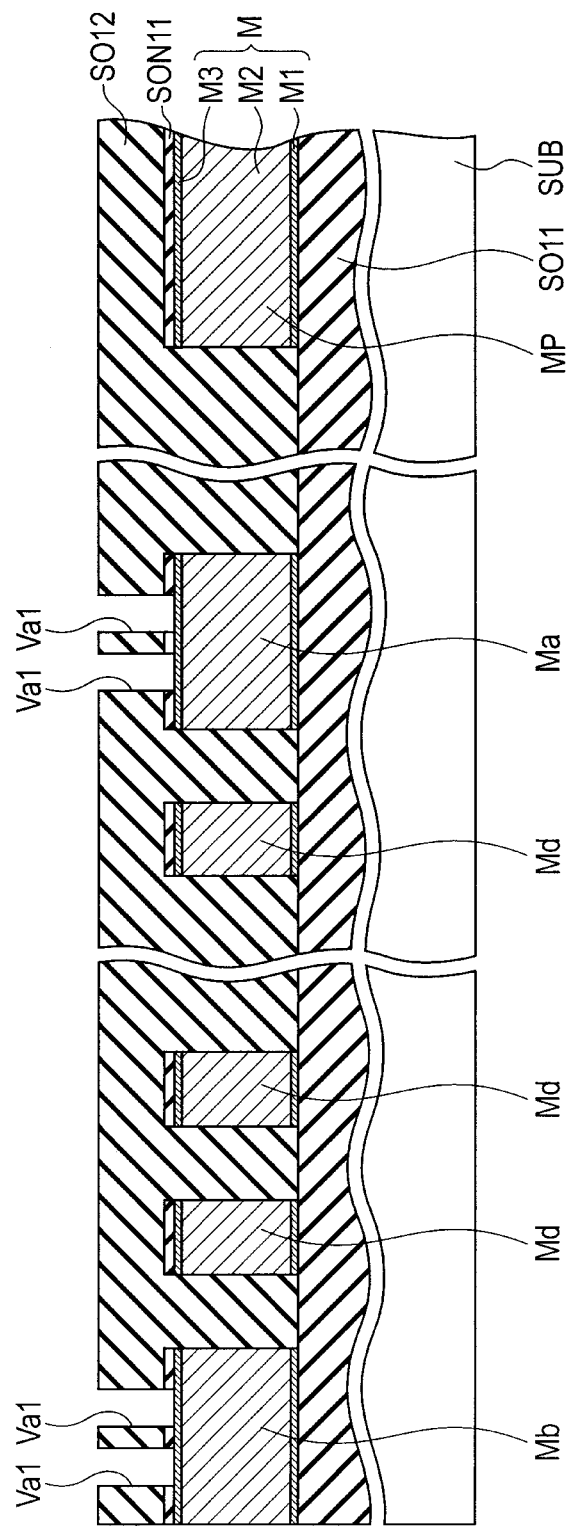
FIG. 7 is a schematic cross-sectional view illustrating a fourth step of the manufacturing method of the semiconductor device of Embodiment 1 of the invention.

Next, as illustrated in FIG. 7, contact holes Va1 communicating with the tap layers Ma and Mb, respectively, are formed in the second interlayer insulating film SO12 by using photolithography and dry etching. To secure stability of the contact resistance, the contact hole Va1 is provided preferably at two or more positions on each of the tap layers.

Figure 8:
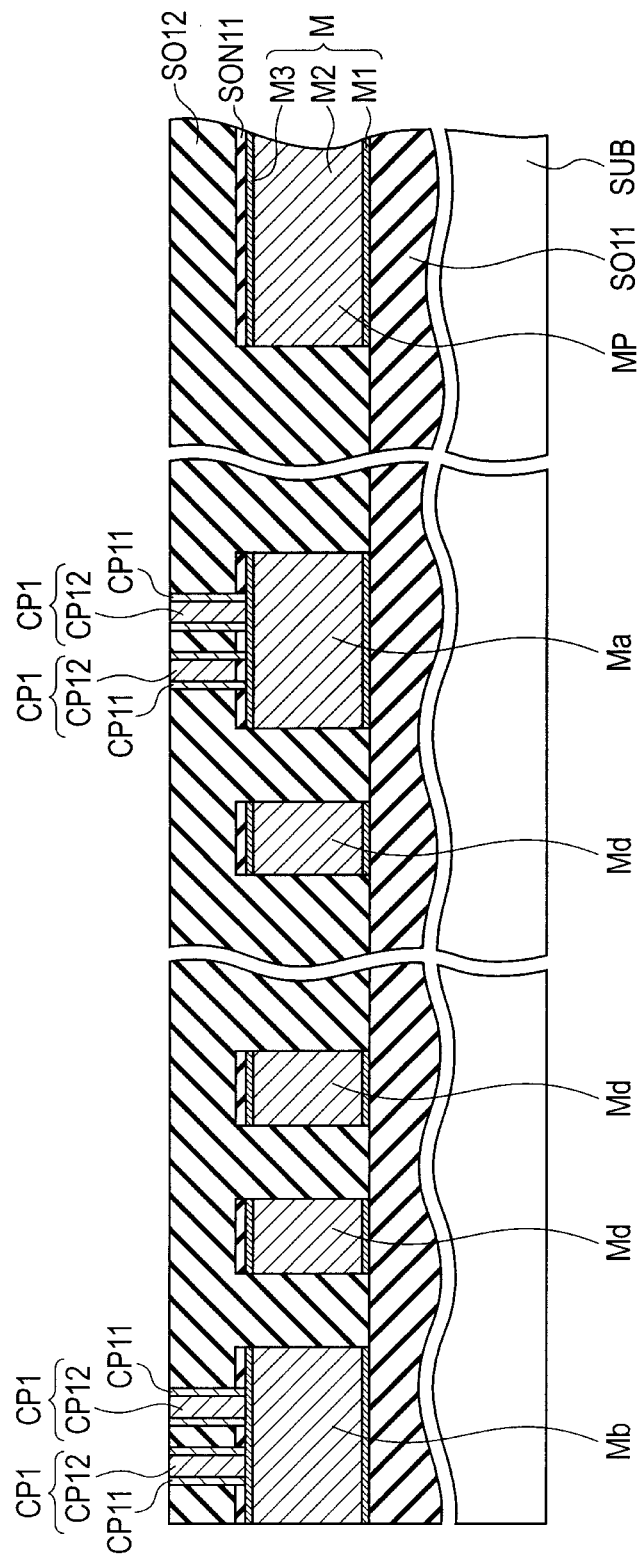
FIG. 8 is a schematic cross-sectional view illustrating a fifth step of the manufacturing method of the semiconductor device of Embodiment 1 of the invention.

Next, as illustrated in FIG. 8, a contact plug CP1 is formed in the contact hole Va1. In the contact hole Va1, a TiN/Ti film stack CP11 is formed as a barrier metal by using sputtering, followed by the formation of a tungsten (W) film CP12 by using CVD. Then, the upper surfaces of the TiN/Ti film stack CP11 and the tungsten (W) film CP12 are planarized using CMP.

Figure 9:
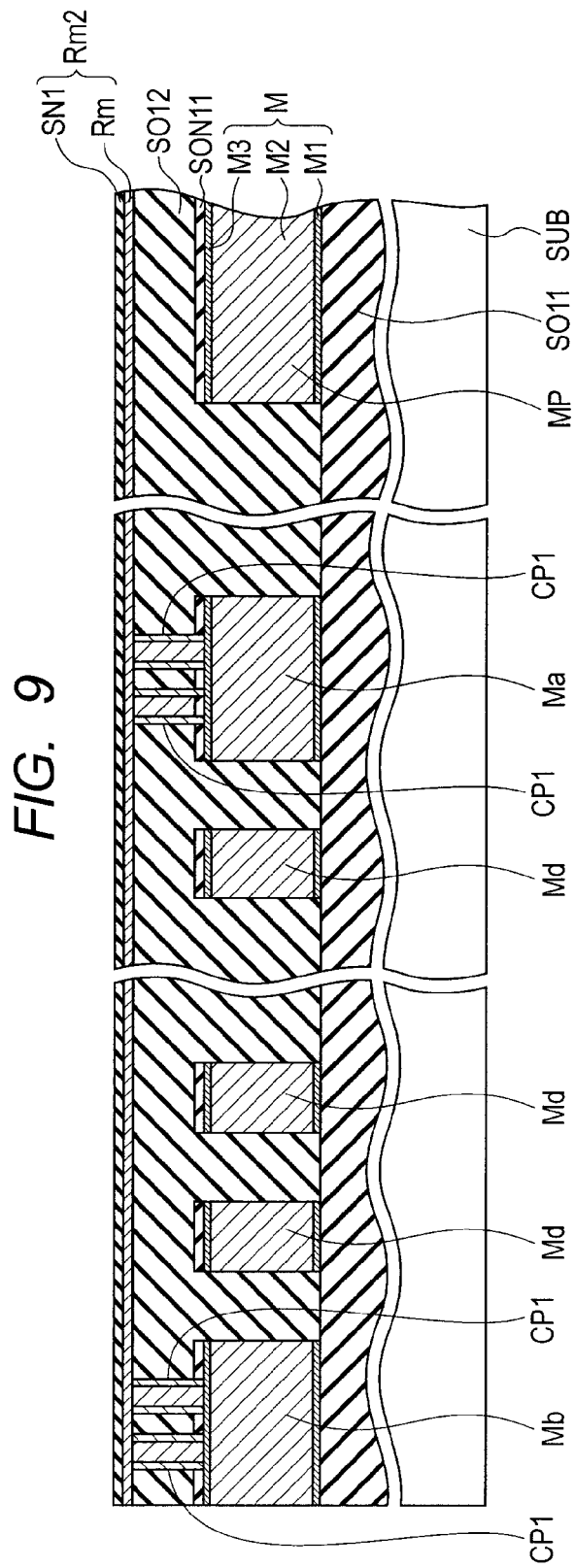
FIG. 9 is a schematic cross-sectional view illustrating a sixth step of the manufacturing method of the semiconductor device of Embodiment 1 of the invention.

Next, as illustrated in FIG. 9, a metal resistor layer Rm2 is formed over the second interlayer insulating film SO12. The metal resistor layer Rm2 has a two-layer structure having a metal interconnect layer Rm and an antioxidant film layer SN1. As the metal interconnect layer Rm, a TiN film is formed as one example of a refractory metal film by using sputtering. To achieve a resistance of about 40Ω/□, the metal interconnect layer has a film thickness of, for example, about 30 nm.

As the antioxidant film layer SN1, a plasma nitride (P-SiN) film is used and it is formed using CVD. The film thickness is, for example, about 45 nm.

Figure 10:
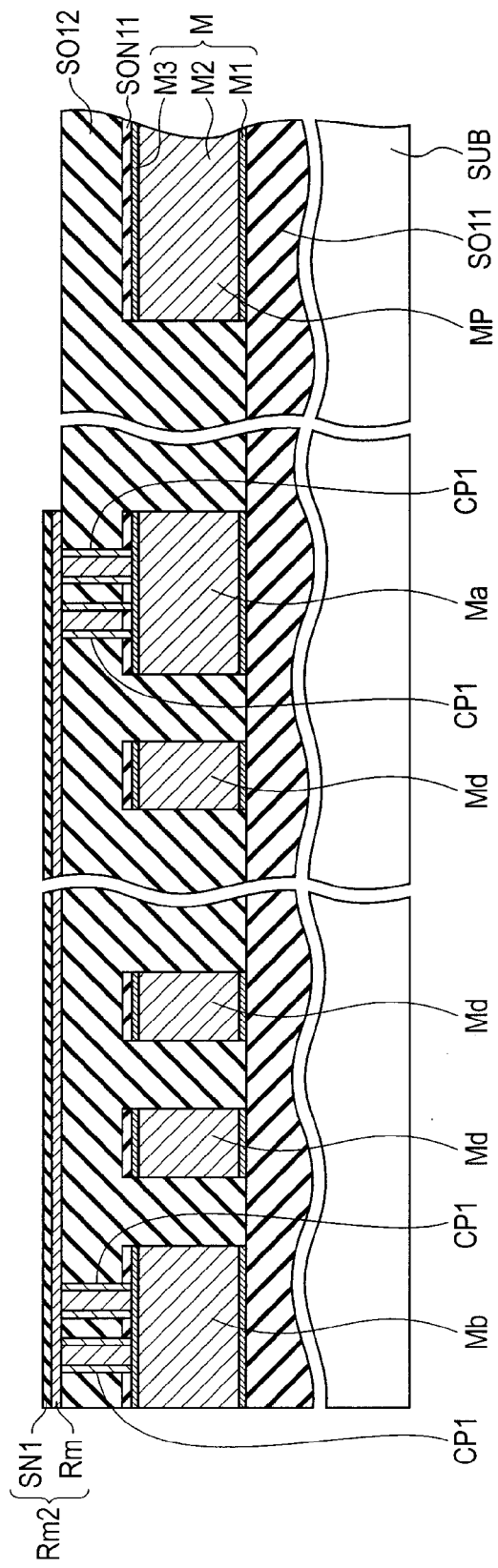
FIG. 10 is a schematic cross-sectional view illustrating a seventh step of the manufacturing method of the semiconductor device of Embodiment 1 of the invention.

Next, as illustrated in FIG. 10, the metal resistor layer Rm2 is patterned using photolithography and dry etching.

By this step, patterning is performed to obtain metal resistor layers Rm1 to Rm4 (including a dummy metal resistor layer Rmd) in the form of stripes as illustrated in the plan view of FIG. 2. At the same time, the metal resistor layers Rm1 to Rm4 are electrically coupled to the tap layers Mi, Ma, Mb, Mc, and Mo via the contact plug CP1, whereby they are coupled in series.

In the present embodiment, the width of the metal resistor layer Rm is adjusted to about 0.8 μm to meet a demand for improvement in the processing size stability and a demand for reduction in layout area. In addition, the pattern-to-pattern width (distance between the resistors) is about 0.6 μm.

The number of unit resistors linked in series and the length of the unit resistors are determined, depending on the required resistance value. When the length of the unit resistor is extremely short, however, the influence of the tap layer in the total resistance becomes too large, resulting in deterioration in resistance accuracy. Accordingly, the length of the metal resistor layer (unit resistor) is controlled to preferably about 40 μm or greater.

The antioxidant film layer SN1 prevents exposure of the surface of the metal resistor layer Rm2 to an oxidizing atmosphere when a resist is removed in an oxygen plasma atmosphere.

Figure 11:
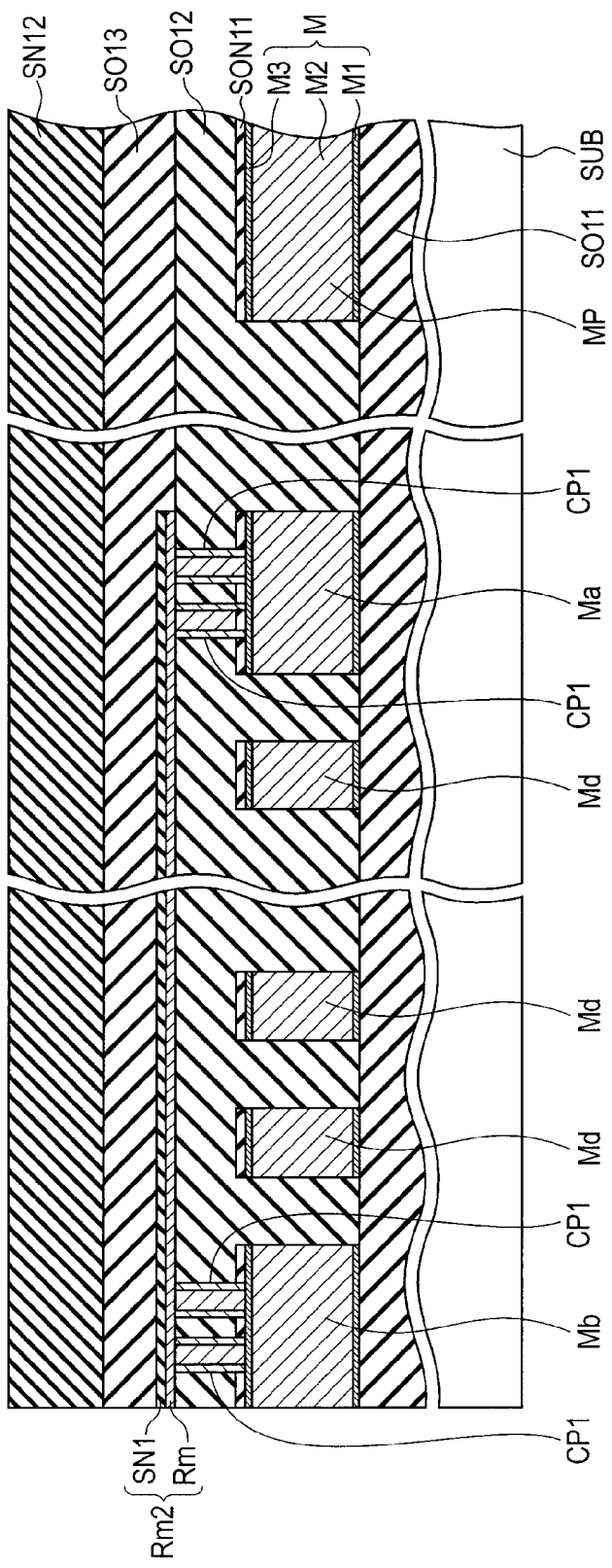
FIG. 11 is a schematic cross-sectional view illustrating an eighth step of the manufacturing method of the semiconductor device of Embodiment 1 of the invention.

Next, as illustrated in FIG. 11, a third interlayer insulating film SO13 is formed over the second interlayer insulating film SO12 to cover the metal resistor layer Rm2. As the third interlayer insulating film SO13, a silicon oxide film made of a P-TEOS film is used and it is formed using CVD.

Next, a passivation film SN12 is formed over the third interlayer insulating film SO13. As the passivation film SN12, a P-SiN film is used and it is formed using CVD. The passivation film SN12 is a film for protecting the surface of the semiconductor device from an external damage after completion of a wiring step.

Figure 12:
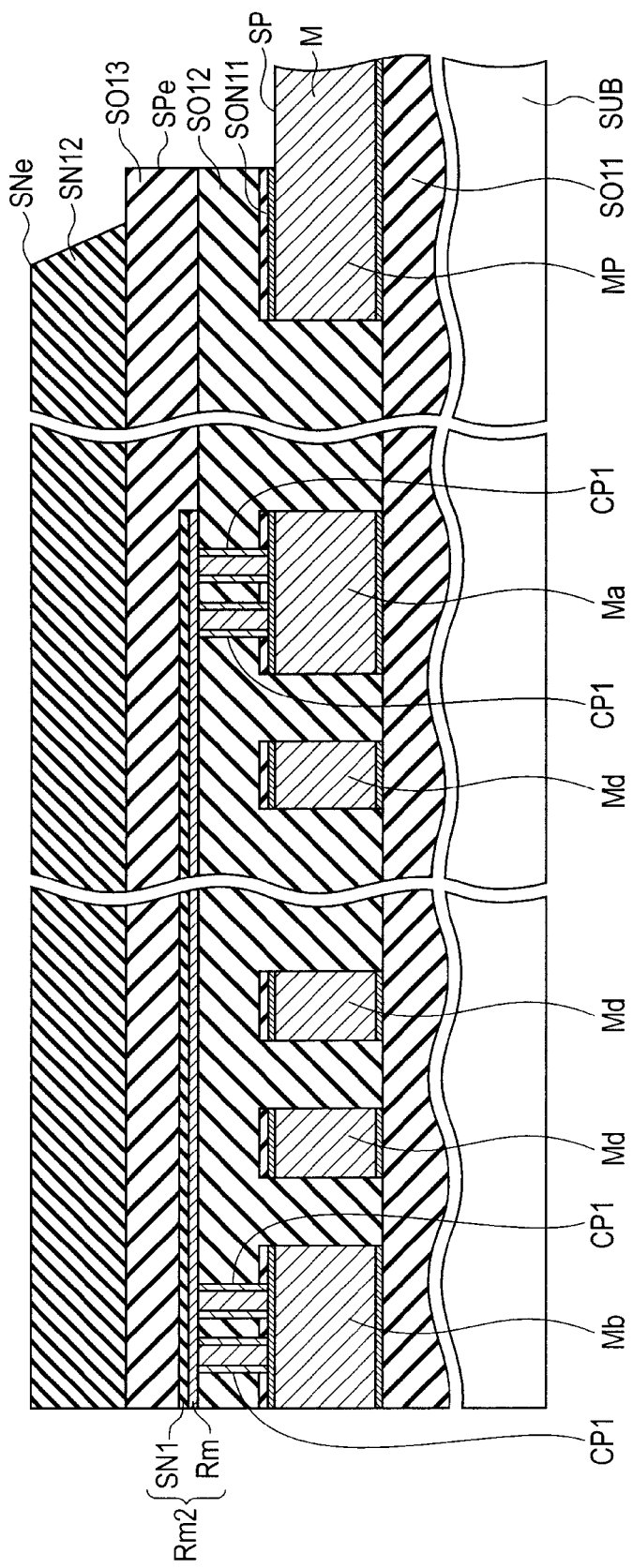
FIG. 12 is a schematic cross-sectional view illustrating a ninth step of the manufacturing method of the semiconductor device of Embodiment 1 of the invention.

Next, as illustrated in FIG. 12, the second interlayer insulating film SO12, the third interlayer insulating film SO13, and the passivation film SN12 are selectively removed by photolithography and dry etching to form a pad opening portion SP from which a portion of the pad region layer MP is exposed. Since isotropic etching is employed in the dry etching of the passivation film SN12, an opening edge SNe of the passivation film SN12 is retreated from an opening end face SPe of the second interlayer insulating film SO12 and the third interlayer insulating film SO13.

Figure 13:
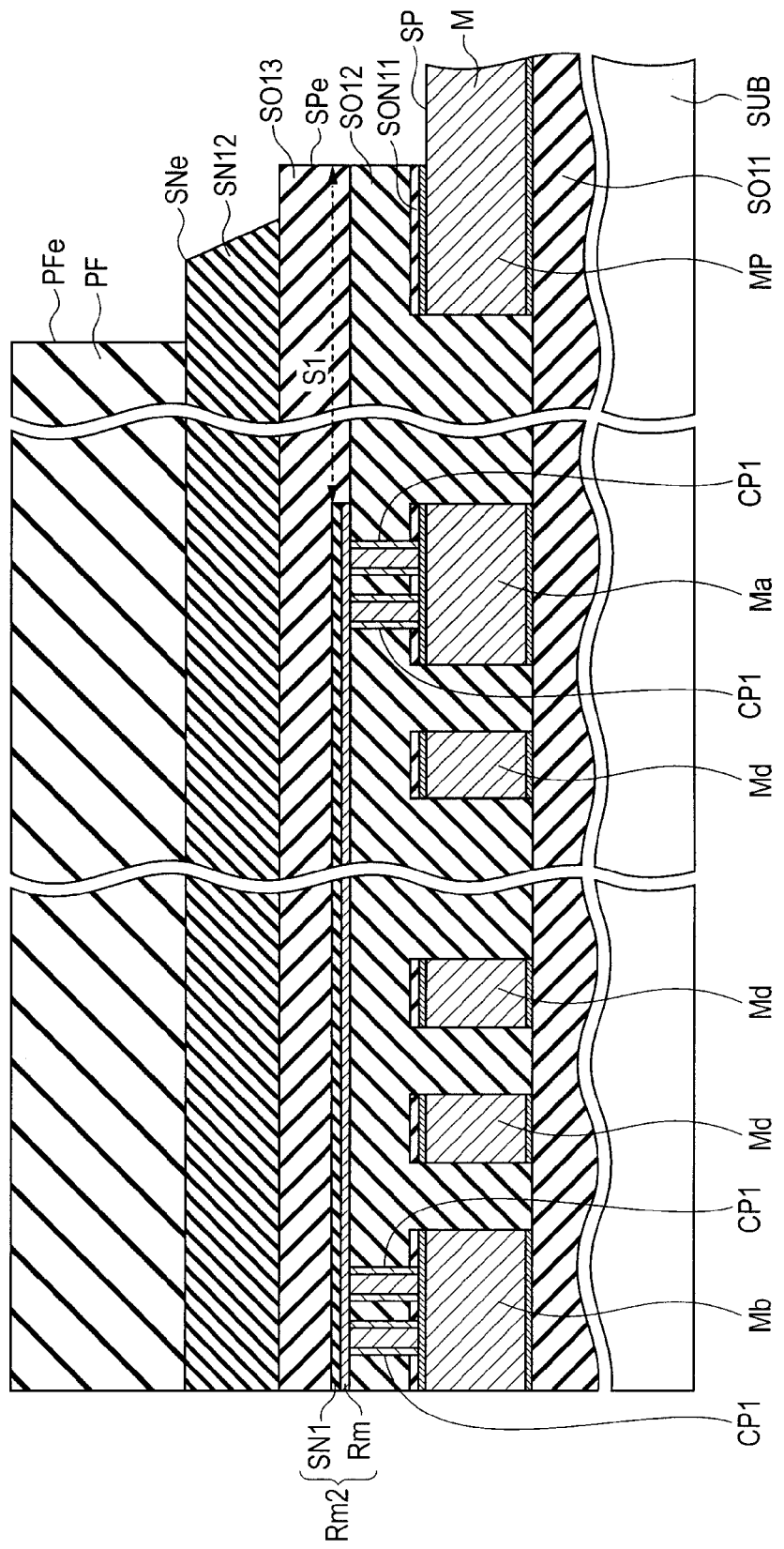
FIG. 13 is a schematic cross-sectional view illustrating a tenth step of the manufacturing method of the semiconductor device of Embodiment 1 of the invention.

Next, as illustrated in FIG. 13, a photosensitive polyimide film is formed by application as a protective film PF on the passivation film SN12 and photolithography is then performed to form a polyimide pattern. An opening end face PFe of the protective film PF is retreated from the opening edge SNe of the passivation film SN12.

Figure 14:
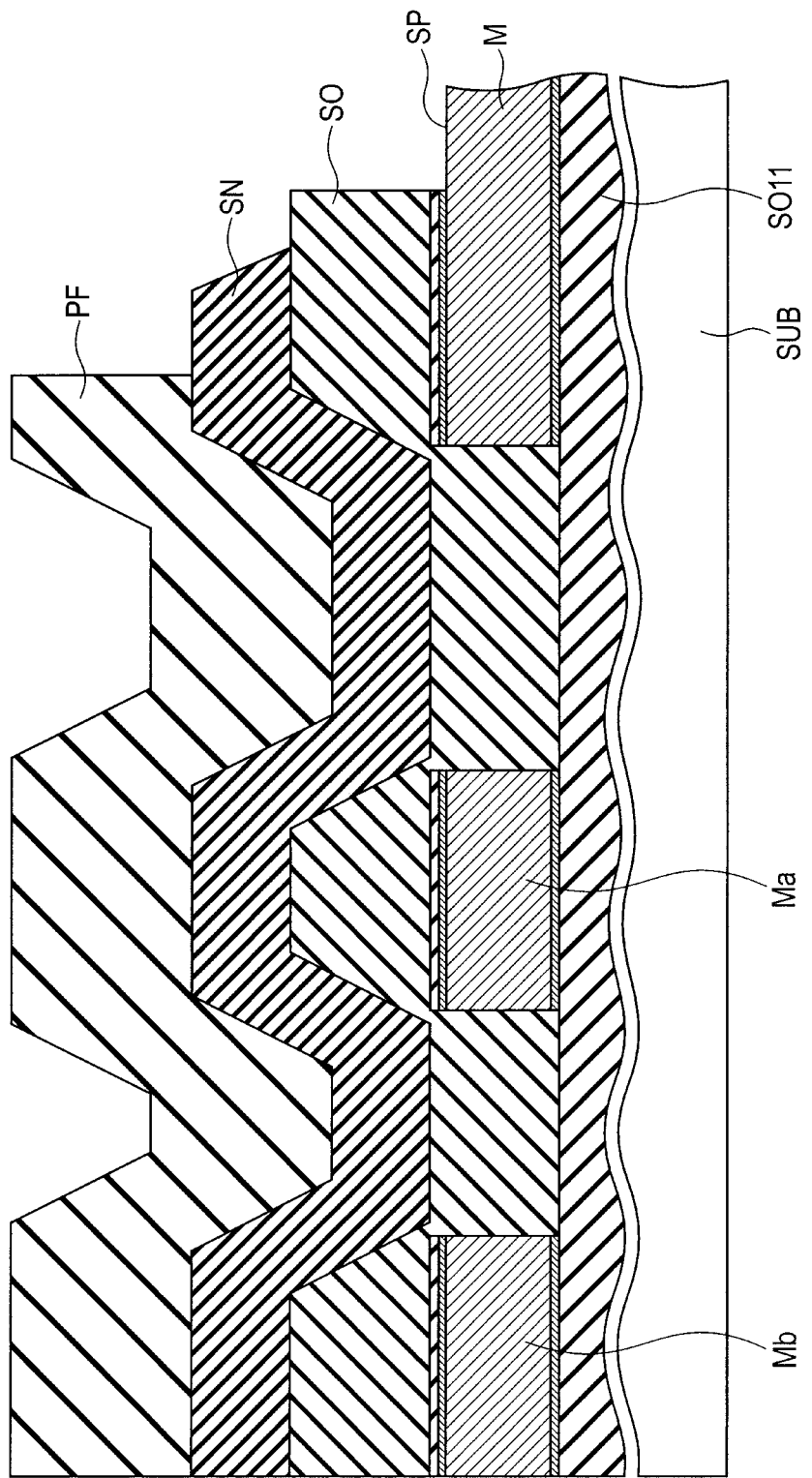
FIG. 14 is a schematic cross-sectional view illustrating the structure of a semiconductor device according to the background art.

By using these steps described above, the semiconductor device illustrated in FIGS. 2 and 3 is completed. Referring to FIG. 14, a conventional structure around the upper-most level aluminum interconnect will next be described. This structure has, on the interconnect layer M serving as the uppermost-level aluminum interconnect thereof, no metal resistor layer Rm.

In semiconductor devices after the 0.15 μm design rule, it is the common practice to form an HDP-USG film SO to eliminate a step difference from the uppermost level aluminum interconnect M prior to the formation of a P-SiN film as the passivation SN in consideration of the thickness of the uppermost level aluminum interconnect M or wiring pitch. Since the step difference of the uppermost level aluminum interconnect M is large, however, a step difference of the passivation film SN and the protective film PF also remains.

It is apparent from the comparison between FIG. 13 and FIG. 14 that in the structure of the present embodiment, the metal resistor layer Rm is formed between the passivation film SN12 and the uppermost level aluminum interconnect M. In addition, prior to the formation of the metal resistor layer Rm, the surface of the second interlayer insulating film SO12 is planarized using CMP. As a result of this treatment, the passivation film SN12 has improved planarity.

Compared with the conventional structure illustrated in FIG. 14, in the structure of the present embodiment illustrated in FIG. 13, oxide films (the second interlayer insulating film SO12 and the third interlayer insulating film SO13) have continuity from the side wall of the pad opening portion SP to the inside of the chip so that the structure facilitates deterioration of the humidity resistance of the metal resistor layer Rm due to penetration of water from the pad opening portion SP.

In order to prevent deterioration of the humidity resistance of the metal resistor layer Rm, therefore, it is preferred to adjust the distance (S1) between the opening end face SPe of the second interlayer insulating film SO12 and the third interlayer insulating film SO13 and the metal resistor layers Rm1 to Rm4 to 100 μm or greater from the standpoint of preventing deterioration of the humidity resistance of the metal resistor layers Rm1 to Rm4 which will otherwise occur due to the penetration of water from the opening end face SPe.

The above structure for preventing deterioration of humidity resistance is suited for not only the structure of the invention but also for the structure of a semiconductor device whose metal resistor layer or the like has deteriorated humidity resistance due to water penetrating from a pad opening portion, because it can overcome this problem effectively.

In the present embodiment, as illustrated in FIG. 3, the description is started with the structure of the uppermost level aluminum interconnect. The device has therebelow a multi-level interconnect structure obtained using a known structure and known formation method and coupled via a tungsten plug or the like. As already described above in the description of the aluminum interconnect structure, a similar metal resistor layer can also be realized in a copper interconnect structure that has recently been employed in high-tech devices.

Also as described above, dummy layers Md having a line width of about 3 μm and a space of about 3 μm are placed perpendicularly below the array arrangement of the metal resistor layers Rm with a view to improving the planarity and resistance accuracy of the metal resistor layers Rm. These dummy layers Mde are grounded and used as a GND line.

The above description is made in the case where TiN, which is a refractory metal, is used as one example of the metal resistor layer Rm, but the material is not limited thereto. Materials used for metal resistor layers usually have a specific resistance smaller than that of semiconductor materials such as polysilicon. Circuits (for example, OCO circuit) requiring a certain level of high resistance are conventionally made of polysilicon.

Using a metal material for the resistor of circuits (for example, OCO circuit), however, needs a substantial increase in the number of sheets in order to achieve a resistance value equal to that of polysilicon. This causes a widening of the layout area disadvantageously. Metal materials for the resistor are therefore preferably materials having a relatively high specific resistance. On the other hand, for the use as a high-precision resistor, the temperature-dependent accuracy of the circuit can be improved when variations of the resistance value are smaller within a temperature guaranteed range of semiconductor device products.

Metal materials for resistor therefore preferably have a temperature coefficient of resistance (TCR) as small as possible.

In the present embodiment, titanium nitride (TiN) is used as a refractory metal satisfying these requests. Instead, a film stack with Ti or titanium nitride having a different nitrogen concentration may be used for controlling the resistance value. In addition, another material such as tantalum nitride (TaN) may be used instead of titanium nitride (TiN) as a material satisfying the above requests.

According to the semiconductor device of the present embodiment and a manufacturing method thereof, the metal resistor layer Rm is placed in a region between the passivation film SN12 and the uppermost level aluminum interconnect M in the semiconductor device. This makes it possible to actualize a high-precision resistor with less variations in resistance value due to a mold stress in or after a packaging step and thereby form a high-precision analogue circuit.

In addition, since the upper portion of the uppermost level aluminum interconnect M is planarized, the passivation film SN12 can have improved planarity and therefore have improved resistance against mechanical failures such as passivation cracks. As a result, a semiconductor device product having improved reliability can be obtained.

Figure 15:
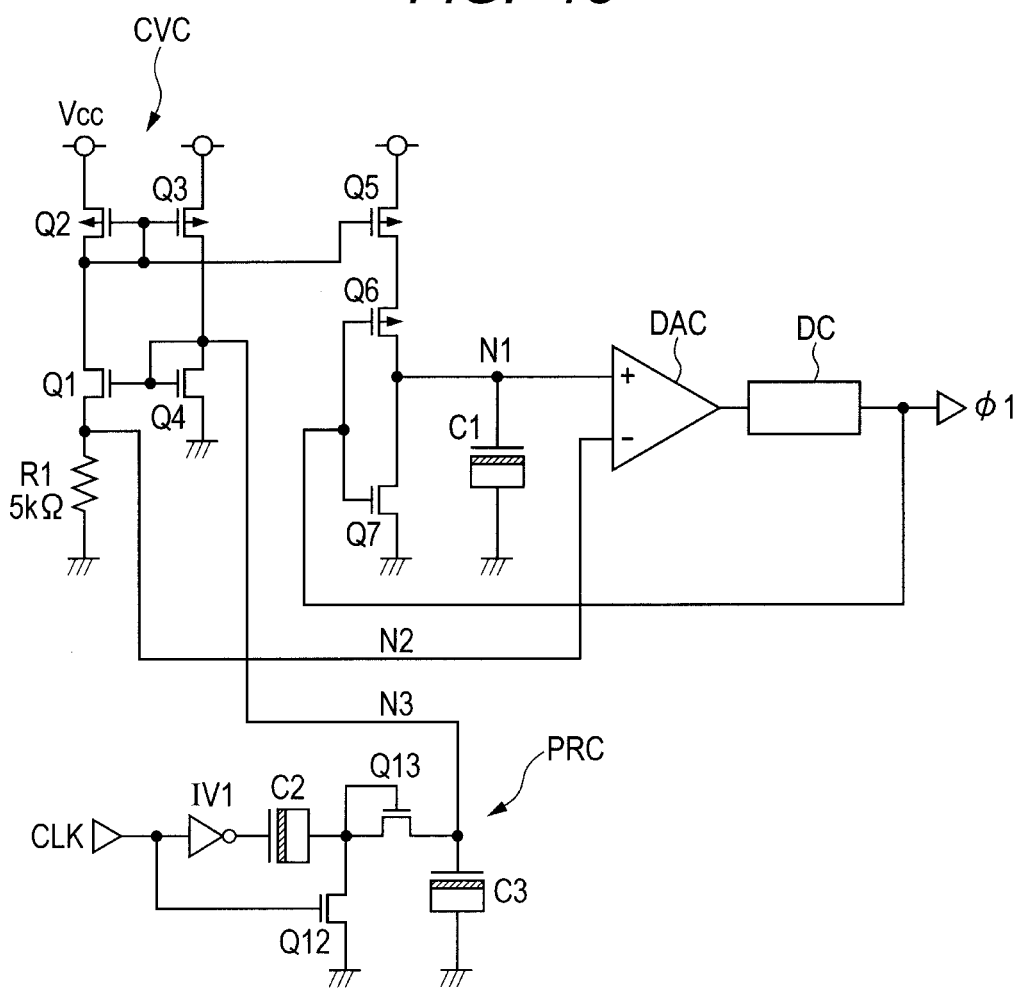
FIG. 15 is a circuit diagram illustrating one example of an oscillator circuit.

Layout with a resistor material made of a metal having a relatively low sheet resistance usually widens the layout area and at the same time, layout is made using another element without using a resistor made of the metal material, which leads to an increase in the chip area. In the present embodiment, however, the metal resistor layer Rm is placed over the uppermost level aluminum interconnect M so that almost all the regions can be used for it freely except a region where the pad opening portion is placed. It is therefore possible to form the metal resistor layer Rm without increasing the chip area. (Specific circuit configuration) Referring to FIG. 15, the specific configuration of an oscillator circuit using the metal resistor layer Rm described above will next be described. This oscillator circuit is, for example, a circuit that generates output signals having a predetermined oscillation cycle by an oscillating operation due to repetition of charge/discharge of a capacitor.

The oscillator circuit has a constant current circuit CVC comprised of a depression type first MOSFET Q1, a resistor R1 having a small resistance (configured as the above metal resistor layer Rm), and enhancement type second MOSFET Q2, third MOSFET Q3, and fourth MOSFET Q4, enhancement type MOSFET Q5 to MOSFET Q7, a capacitor C1 (capacitor), a differential amplifier circuit DAC, a delay circuit DC, and a booster circuit PRC.

In the constant current circuit CVC, the source of MOSFET Q1 and one end of the resistor R1, the drain of MOSFET Q1 and the drain of MOSFET Q2, the gate and drain of MOSFET Q2 and the gate of MOSFET Q3, the drain of MOSFET Q3 and the drain of MOSFET Q4, the gate and drain of MOSFET Q4 and the gate of MOSFET Q1, the source of MOSFET Q2 and Q3 and the power supply voltage Vcc, and the other end of the resistor R1 and the source and an earth-termination voltage of MOSFET Q4 are coupled to each other.

The above circuit configuration enables output of a constant-voltage-level signal. The MOSFET Q1 and the MOSFET Q4 have an N-channel MOS structure, while the MOSFET Q2 and the MOSFET Q3 have a P-channel MOS structure.

To a connection node of the gate of the MOSFET Q2 and the gate of the MOSFET Q3 of the constant current circuit CVC is coupled the gate of MOSFET Q5 having a source coupled to the power supply voltage Vcc. Further, the drain of this MOSFET Q5 is coupled to the source of the MOSFET Q6, the drain of the MOSFET Q6 is coupled to the drain of the MOSFET Q7, and the source of the MOSFET Q7 is coupled to an earth-termination voltage.

Further, the gate of the MOSFET Q6 and the gate of the MOSFET Q7 are commonly coupled to an output terminal of the delay circuit DC. The drain of the MOSFET Q6 and the drain of the MOSFET Q7 are coupled to one end of the capacitor C1 from a connection node therebetween, and then coupled to a positive input terminal of the differential amplifier circuit DAC.

In the differential amplifier circuit DAC, a constant voltage level generated at the constant current circuit CVC is compared with a voltage level of the capacitor C1. Based on the comparison results, the capacitor C1 is charged or discharged.

The booster circuit PRC has an inverter IV1, enhancement type n-channel MOSFETs Q12 and Q13, and capacitors C2 and C3. A seizing signal CLK is input to the circuit and an output voltage thus boosted is applied to a connection node between the gate of the MOSFET Q4 and the gate of the MOSFET Q1 in the constant current circuit CVC.

In the booster circuit PRC, the seizing signal CLK is input to the inverter IV1 and the gate of MOSFET Q12. The output terminal of this inverter IV1 and one end of the capacitor C2, the other end of the capacitor C2 and the drain of the MOSFET Q12, the gate and drain of MOSFET Q13, and the source of the MOSFET Q13 and one end of the capacitor C3 are coupled to each other. The source of MOSFET Q12 and the other end of the capacitor C3 are coupled to earth-termination voltages, respectively.

Embodiment 2

Next, referring to FIGS. 16 and 17, a partial structure of a high-speed OCO circuit will be described as one example of a semiconductor device. The entire structure of a microcomputer chip is similar to that of FIG. 1. FIG. 17 is a cross-section taken in the direction of arrows along the line XVII-XVII in FIG. 16.

As illustrated in FIG. 17, this semiconductor device has a first interlayer insulating film SO21 provided over a substrate SUB and a plurality of first dummy layers MLd provided over the first interlayer insulating film SO21, arranged to have a predetermined space between any adjacent two of the first dummy layers in a first direction (direction X in FIG. 17), and extending in a second direction (direction Y in FIG. 16) perpendicular to the first direction (direction X).

The first interlayer insulating film SO21 has thereover tap layers MLa and MLb provided with a predetermined space in the second direction (direction Y) at a position sandwiching the plurality of first dummy layers MLd from both sides thereof in the first direction (direction X). In a planar view illustrated in FIG. 16, tap layers MLi, MLa to MLc, and MLo are provided.

As illustrated in FIG. 17, the first interlayer insulating film SO21 has thereover a lower-level interconnect layer ML formed in the same step as that of forming the first dummy layers MLd and the tap layers MLa and MLb.

The plurality of the first dummy layers MLd, the tap layers MLa and MLb, and the lower-level interconnect layer ML are covered with a second interlayer insulating film SO22 having a planarized surface. The second interlayer insulating film SO22 has thereover a metal resistor layer RLm2 extending in the first direction (direction X). The metal resistor layer RLm2 has a two-layer structure having a metal resistor layer RLm and an antioxidant film layer SN21.

Figure 16:
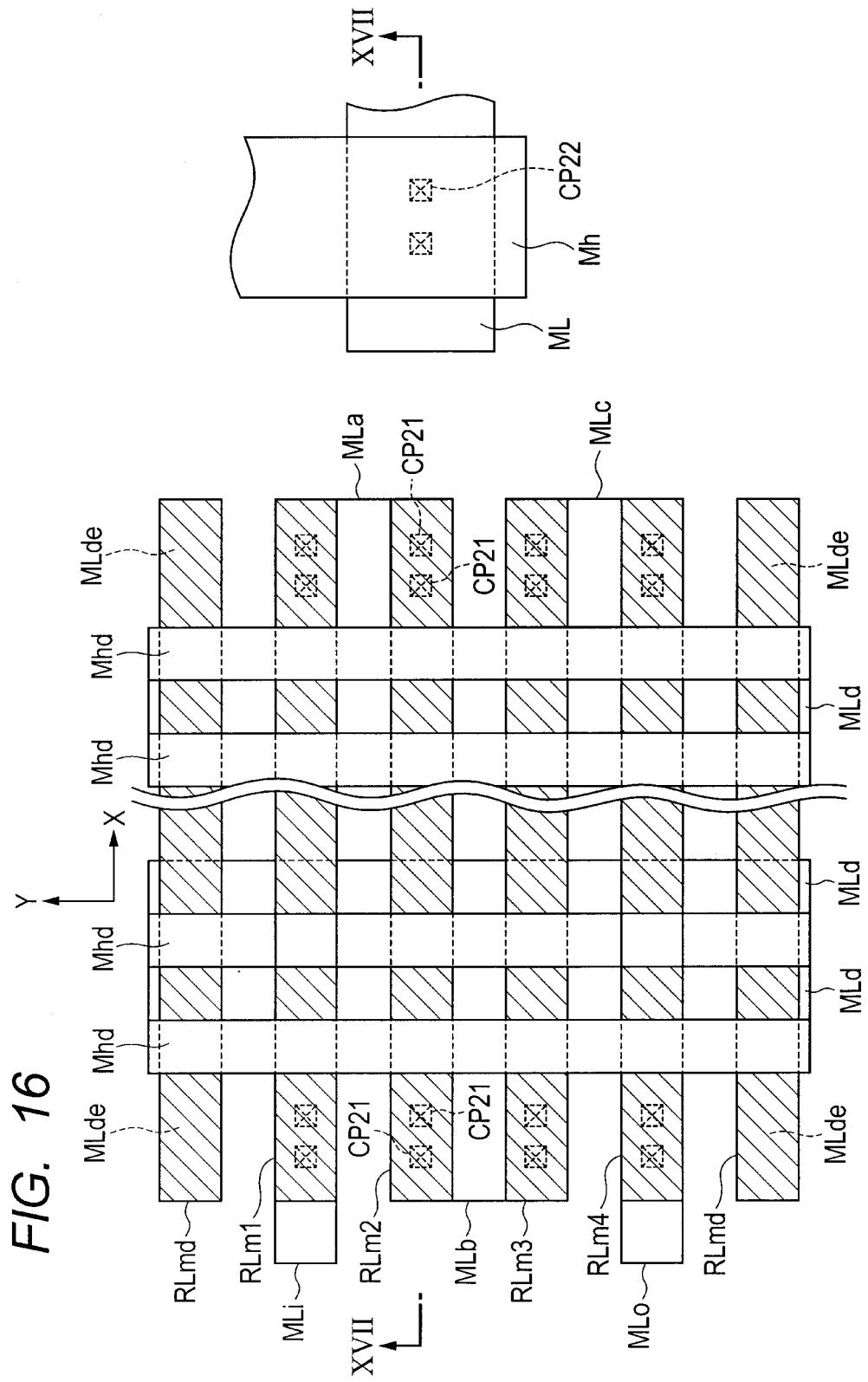
FIG. 16 illustrates a planar structure of a semiconductor device according to Embodiment 2 of the invention.
Figure 17:
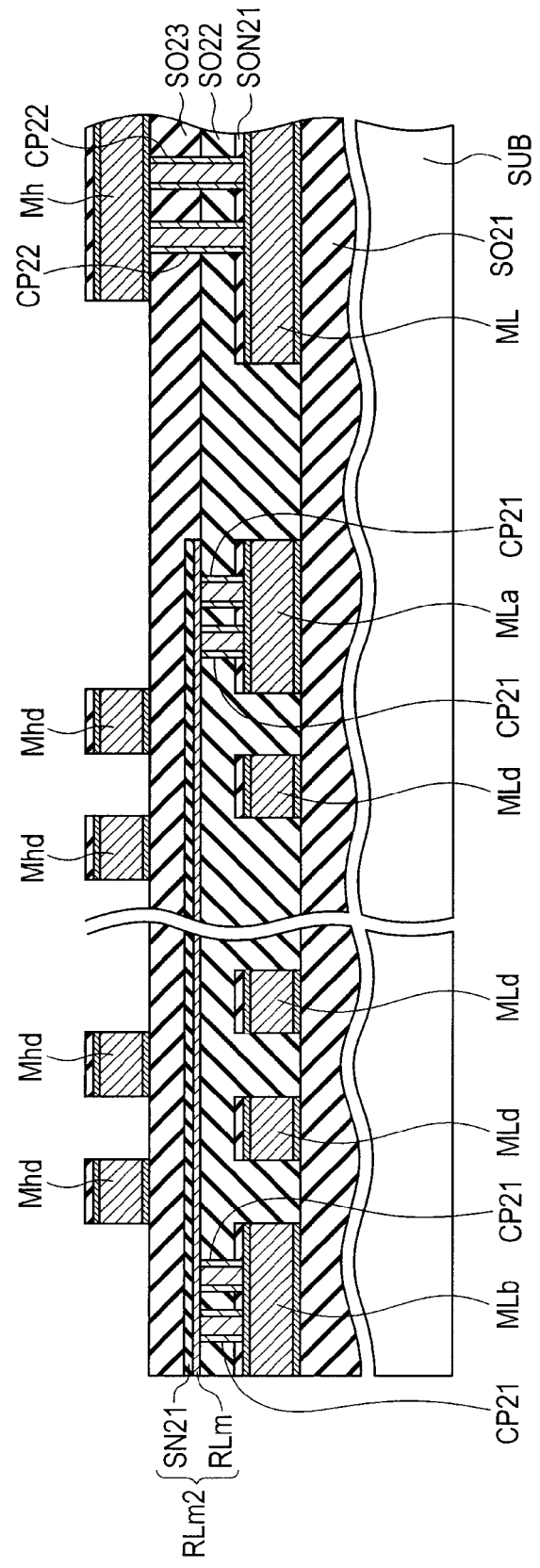
FIG. 17 is a cross-sectional view taken in the direction of arrows along the line XVII-XVII in FIG. 16.

In the planar view of FIG. 16, metal resistor layers RLm1 to RLm4 extend in the first direction (direction X) and have a predetermined space between any adjacent two thereof in the second direction (direction Y). The metal resistor layers RLm1 to RLm4 have, at both ends thereof, contact plugs CP21 penetrating through the second interlayer insulating film SO22 and linked to the tap layers MLi, MLa to MLc, and MLo.

From the standpoint of improving the manufacturing precision in photolithography, the metal resistor layers RLm1 and RLm4 have, on the respective outsides thereof, a dummy metal resistor layer RLmd and a dummy tap layer MLde.

As a result, the metal resistor layers Rm1 to Rm4 are electrically coupled in series in the following manner: tap layer MLi→contact plug CP21→metal resistor layer RLm1→contact plug CP21→tap layer MLa→contact plug CP21→metal resistor layer RLm2→contact plug CP21→tap layer MLb→contact plug CP21→metal resistor layer RLm3→contact plug CP21→tap layer MLc→contact plug CP21→metal resistor layer RLm4→contact plug CP21→tap layer MLo.

As illustrated in FIG. 17, the metal resistor layer RLm2 is covered with a third interlayer insulating film SO23 having a planarized surface. This third interlayer insulating film SO23 has thereover a plurality of second dummy layers Mhd arranged to have a predetermined space between any adjacent two thereof in the first direction (direction X in FIG. 16) and extending in a second direction (direction Y in FIG. 16) perpendicular to the first direction (direction X).

With regards to the plurality of first dummy layers MLd and the plurality of second dummy layer Mhd, two first dummy layers MLd adjacent to each other have therebetween the second dummy layer Mhd in a planar view. The plurality of first dummy layers MLd and the plurality of second dummy layers Mhd are grounded and use as a GND line.

The third interlayer insulating film SO23 has thereover an upper-level interconnect layer Mh formed in the same step as that of forming the second dummy layers Mhd. The lower-level interconnect layer ML and the upper-level interconnect layer Mh are electrically coupled to each other via a contact plug CP22 penetrating through the second interlayer insulating film SO22 and the third interlayer insulating film SO23.

According to the configuration in the present embodiment, the metal resistor layer RLm is formed in an interlayer film of an intermediate layer of a multilayer aluminum interconnect structure so that a known multi-layer interconnect structure is employed for layers below the first interlayer insulating film SO21 and layers over the third interlayer insulating film SO23. (Manufacturing method) Next, referring to FIGS. 18 to 29, a manufacturing method of the semiconductor device illustrated in FIGS. 16 and 17 will be described. Each step of the manufacturing method described below corresponds to the cross-section taken in the direction of arrows along the line XVII-XVII in FIG. 16.

Figure 18:
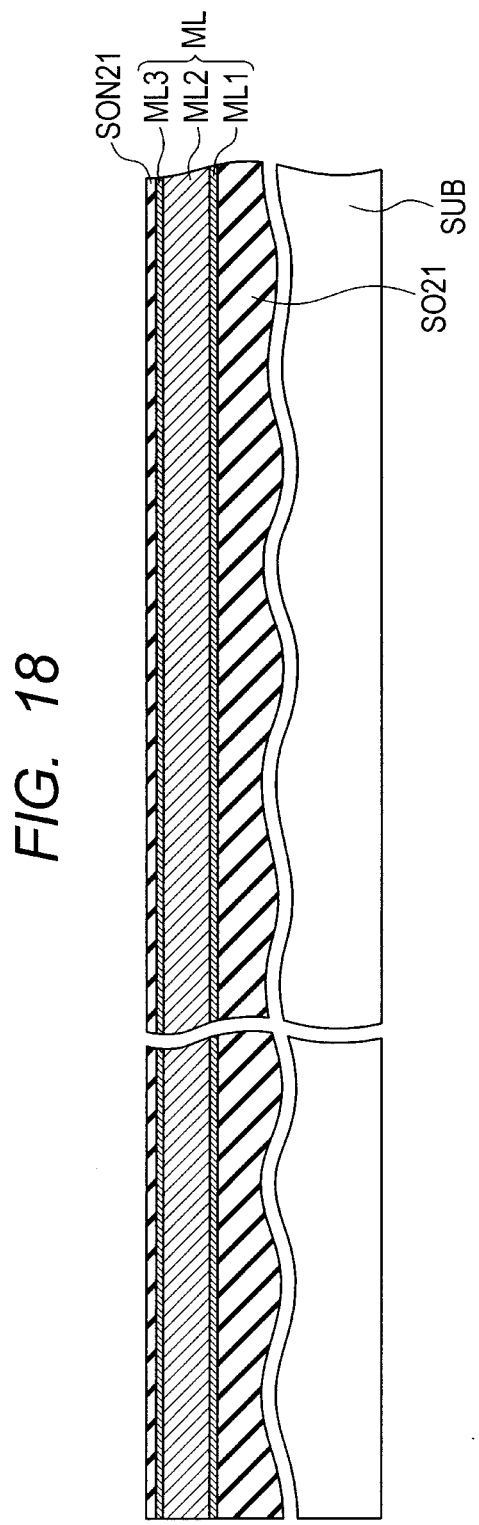
FIG. 18 is a schematic cross-sectional view illustrating a first step of a manufacturing method of the semiconductor device of Embodiment 2 of the invention.

As illustrated in FIG. 18, after formation of a known multilayer interconnect structure over a substrate SUB, a first interlayer insulating film SO21 having a planarized surface is formed. As the first interlayer insulating film SO21, a silicon oxide film made of HDP-USG and P-TEOS is used. The substrate SUB may be a semiconductor substrate having a semiconductor element integrated therein or a substrate made of a material other than semiconductor.

Next, an intermediate interconnect layer ML is formed over the first interlayer insulating film SO21. The interconnect layer ML is an intermediate aluminum interconnect and is formed using sputtering. The interconnect layer ML has a film stack structure having a TiN/Ti film as a bottom layer ML1, a copper-added aluminum (Al—Cu) film as an interconnect body ML2, and a TiN/Ti film as a top layer ML3. The interconnect layer ML has a thickness of from about 300 nm to about 400 nm.

Next, an antireflective film SON21 is formed over the intermediate interconnect layer ML. As the antireflective film SON21, a plasma oxynitride film (P-SiON) is formed using CVD.

Figure 19:
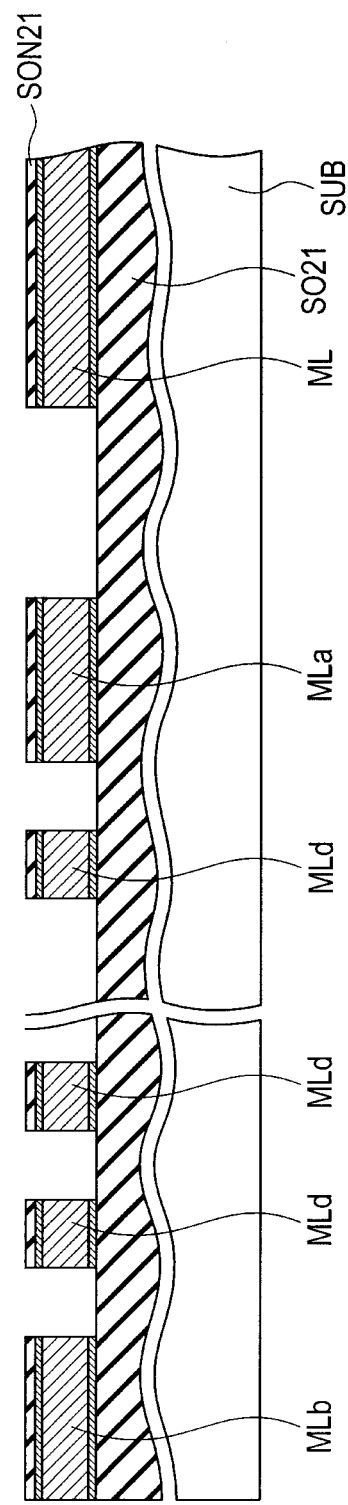
FIG. 19 is a schematic cross-sectional view illustrating a second step of the manufacturing method of the semiconductor device of Embodiment 2 of the invention.

Next, as illustrated in FIG. 19, the intermediate interconnect layer ML and the antireflective film SON21 are patterned. For the patterning, photolithography and dry etching are employed. As a result of the patterning, a plurality of first dummy layers MLd arranged to have a predetermined space between any two adjacent layers thereof in a first direction (direction X) and extending in a second direction (direction Y) perpendicular to the first direction (direction X); tap layers MLa and MLb arranged at a position sandwiching the plurality of first dummy layers MLd from both sides thereof in the first direction (direction X); and the intermediate interconnect layer ML having a predetermined shape are formed.

Figure 20:
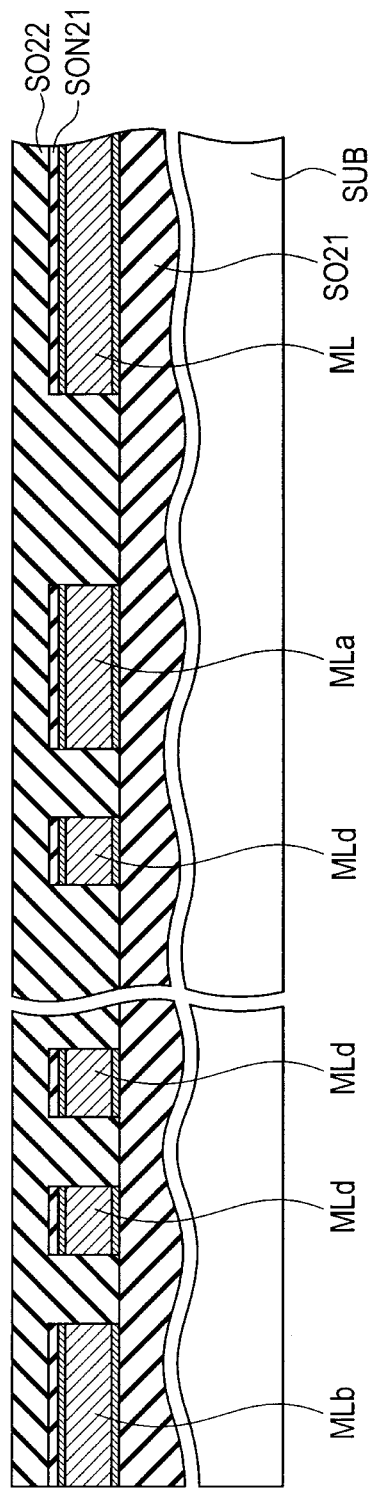
FIG. 20 is a schematic cross-sectional view illustrating a third step of the manufacturing method of the semiconductor device of Embodiment 2 of the invention.

Next, as illustrated in FIG. 20, a second interlayer insulating film SO22 covering therewith the first dummy layers MLd, the tap layers MLa and MLb, and the intermediate interconnect layer ML is formed. As the second interlayer insulating film SO22, a silicon oxide film made of HDP-USG and P-TEOS is used. The surface of the silicon oxide film is planarized using CMP.

The HDP-USG film is required to have a film thickness of about 500 nm or greater in order to cover therewith a step difference of the aluminum interconnect. As a polishing amount for planarization, about 1.5 times the step difference is necessary. The first dummy layers MLd are placed with an equal distance, for example, with a line width of about 3 μm and a space of about 3 μm to achieve good planarity of a metal resistor layer RLm to be formed later.

Figure 21:
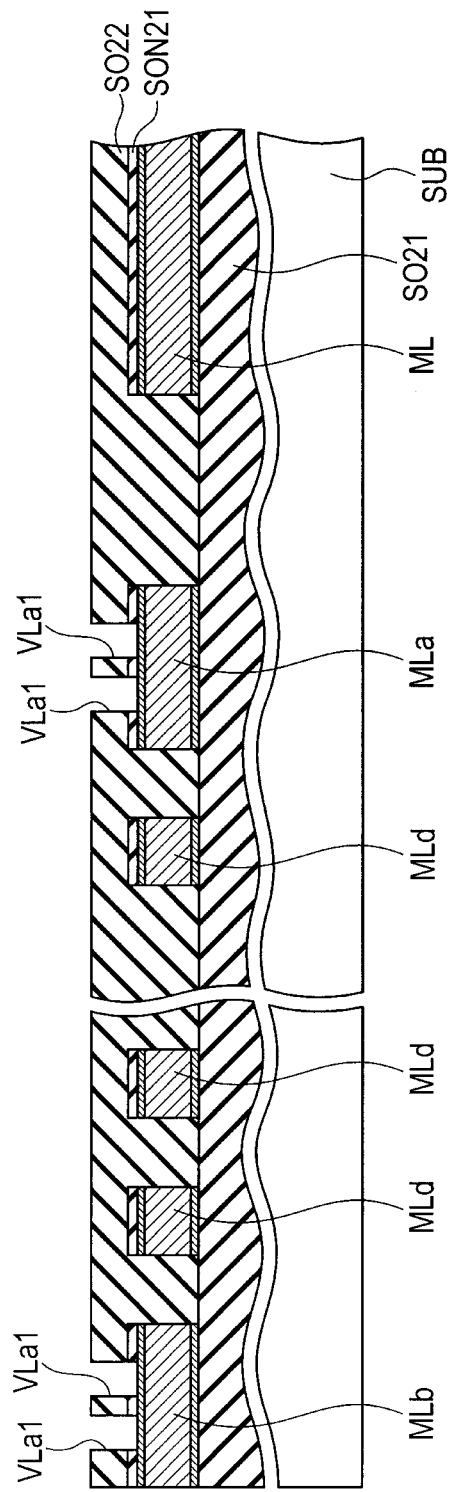
FIG. 21 is a schematic cross-sectional view illustrating a fourth step of the manufacturing method of the semiconductor device of Embodiment 2 of the invention.

Next, as illustrated in FIG. 21, contact holes VLa1 communicating with the tap layers MLa and MLb, respectively, are formed in the second interlayer insulating film SO22 by using photolithography and dry etching. To secure stability of the contact resistance, the contact hole VLa1 is provided preferably at two or more positions on each of the tap layers.

Figure 22:
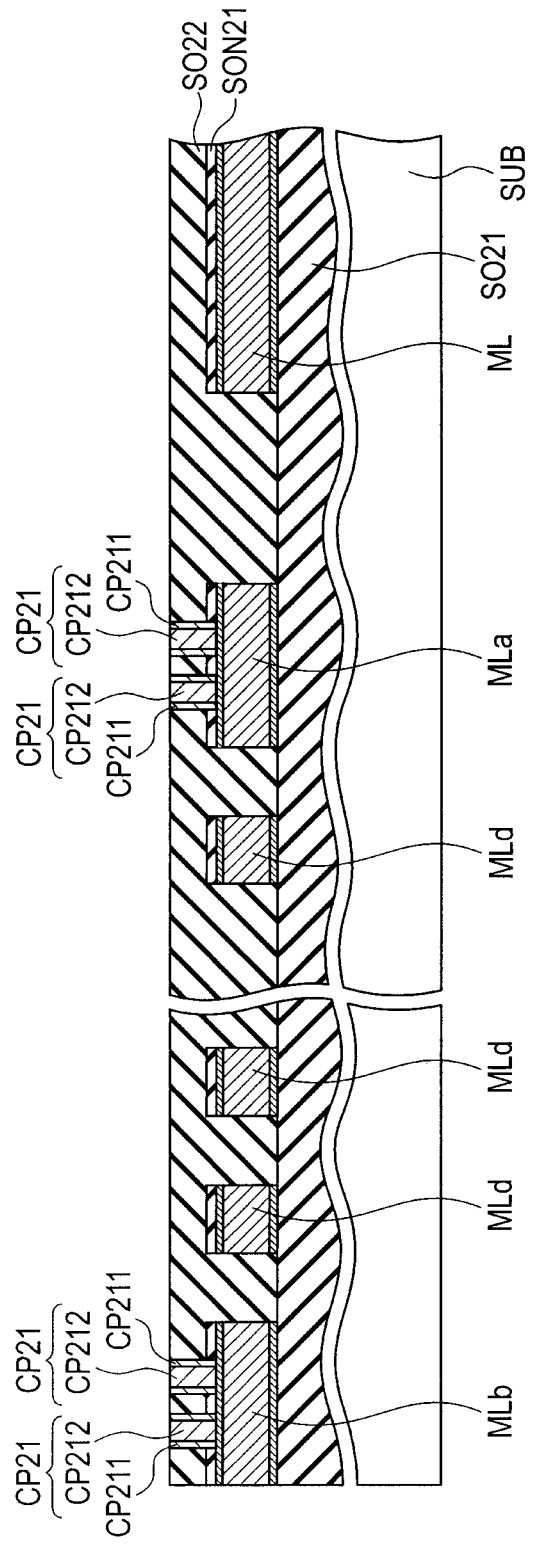
FIG. 22 is a schematic cross-sectional view illustrating a fifth step of the manufacturing method of the semiconductor device of Embodiment 2 of the invention.

Next, as illustrated in FIG. 22, a contact plug CP21 is formed in the contact hole VLa1. In the contact hole VLa1, a TiN/Ti film stack CP211 is formed as a barrier metal by using sputtering, followed by the formation of a tungsten (W) film CP212 by using CVD. Then, the upper surfaces of the TiN/Ti film stack CP211 and the tungsten (W) film CP212 are planarized using CMP.

Figure 23:
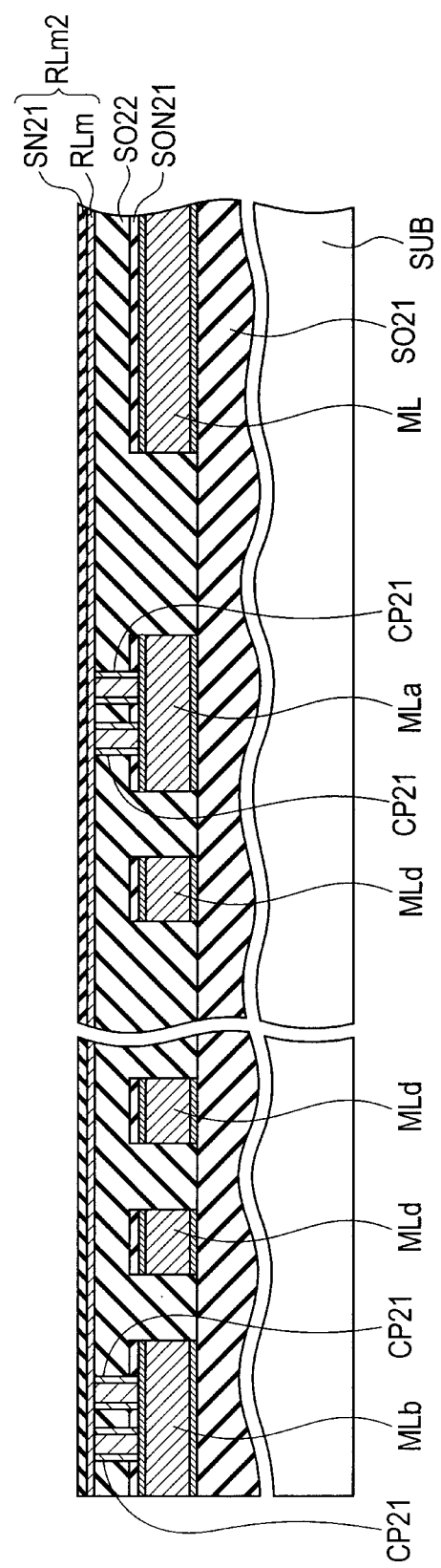
FIG. 23 is a schematic cross-sectional view illustrating a sixth step of the manufacturing method of the semiconductor device of Embodiment 2 of the invention.

Next, as illustrated in FIG. 23, a metal resistor layer RLm2 is formed over the second interlayer insulating film SO22. The metal resistor layer RLm2 has a two-layer structure having a metal interconnect layer RLm and an antioxidant film layer SN21. As the metal interconnect layer RLm, a TiN film is formed as one example of a refractory metal by using sputtering. To achieve a resistance of about 40Ω/□, the metal resistor layer has a film thickness of, for example, about 30 nm.

As the antioxidant film layer SN1, a plasma nitride (P-SiN) film is used and it is formed using CVD. The film thickness is, for example, about 45 mm.

Figure 24:
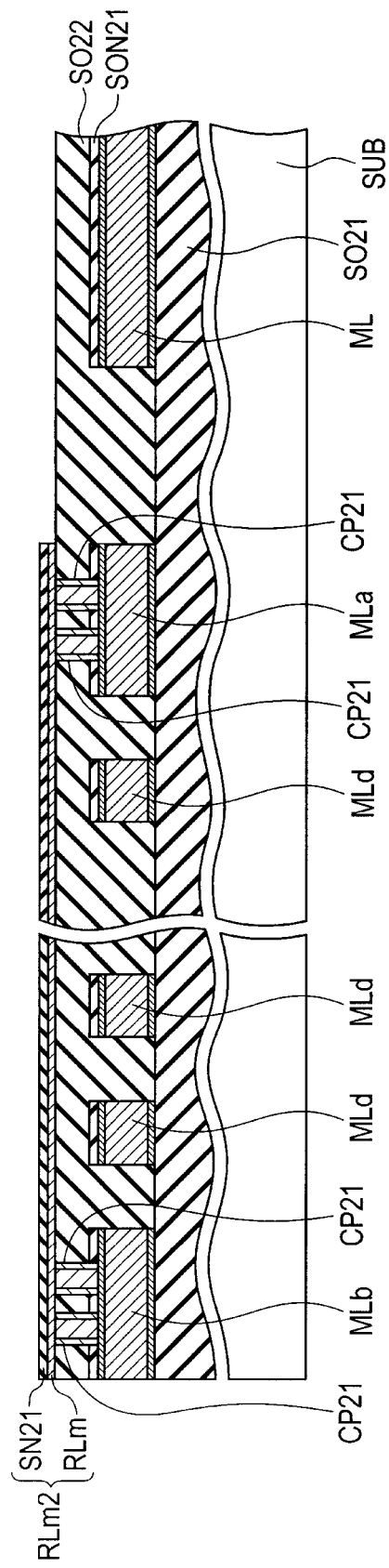
FIG. 24 is a schematic cross-sectional view illustrating a seventh step of the manufacturing method of the semiconductor device of Embodiment 2 of the invention.

Next, as illustrated in FIG. 24, the metal resistor layer RLm2 is patterned using photolithography and dry etching. By this step, patterning is performed to obtain metal resistor layers RLm1 to RLm4 (including the dummy metal resistor layer RLmd) in the form of stripes as illustrated in the plan view of FIG. 16. At the same time, the metal resistor layers RLm1 to RLm4 are electrically coupled to the tap layers MLi, MLa, MLb, MLc, and MLo via the contact plug CP21, whereby they are coupled in series.

In the present embodiment, the width of the metal resistor layer RLm is about 0.8 μm to meet a demand for improvement in the processing size stability and a demand for reduction in layout area. In addition, the pattern-pattern width (distance of the resistors) is about 0.6 μm.

The number of unit resistors linked in series and the length of the unit resistors are determined, depending on a required resistance value. When the length of the unit resistor is extremely short, however, the influence of the tap layers in the total resistance becomes too large, resulting in deterioration in resistance accuracy. Accordingly, the length of the metal resistor layer (unit resistor) is controlled to preferably about 40 μm or greater.

The antioxidant film layer SN21 prevents exposure of the surface of the metal resistor layer RLm2 to an oxidizing atmosphere when resist is removed in an oxygen plasma atmosphere.

Figure 25:
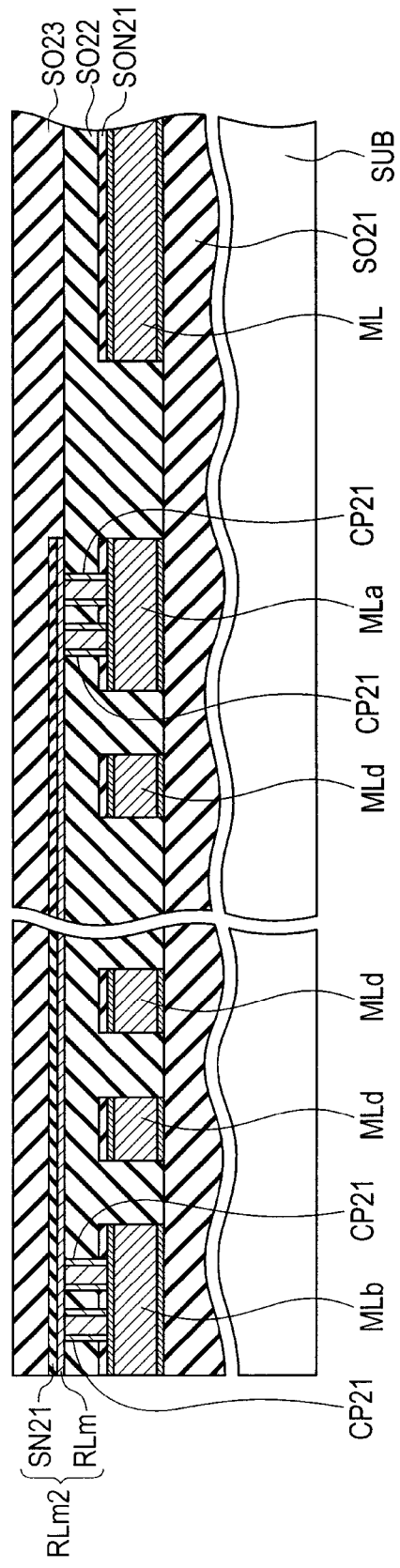
FIG. 25 is a schematic cross-sectional view illustrating an eighth step of the manufacturing method of the semiconductor device of Embodiment 2 of the invention.

Next, as illustrated in FIG. 25, a third interlayer insulating film SO23 is formed over the second interlayer insulating film SO22 to cover the metal resistor layer RLm2. As the third interlayer insulating film SO23, a silicon oxide film made of a P-TEOS film is used and it is formed using CVD.

Figure 26:
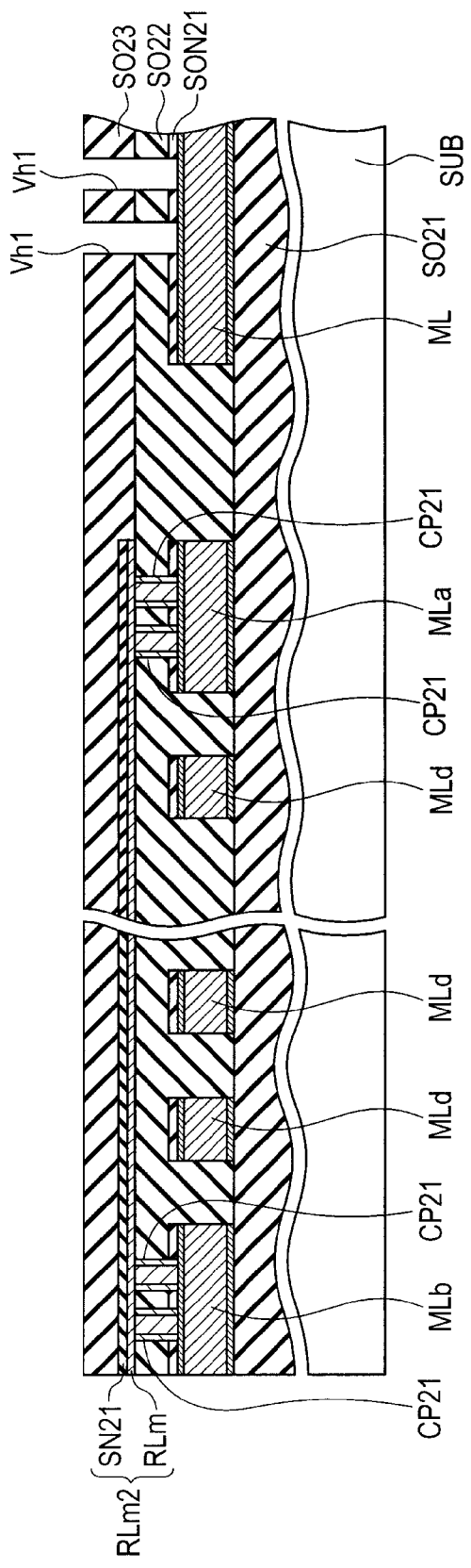
FIG. 26 is a schematic cross-sectional view illustrating a ninth step of the manufacturing method of the semiconductor device of Embodiment 2 of the invention.

Next, as illustrated in FIG. 26, a contact hole Vh1 communicating with the intermediate interconnect layer ML is formed in the second interlayer insulating film SO22 and the third interlayer insulating film SO23 by using photolithography and dry etching. It is preferred that the contact hole Vh1 is provided at two or more positions in order to secure stability of the contact resistance.

Figure 27:
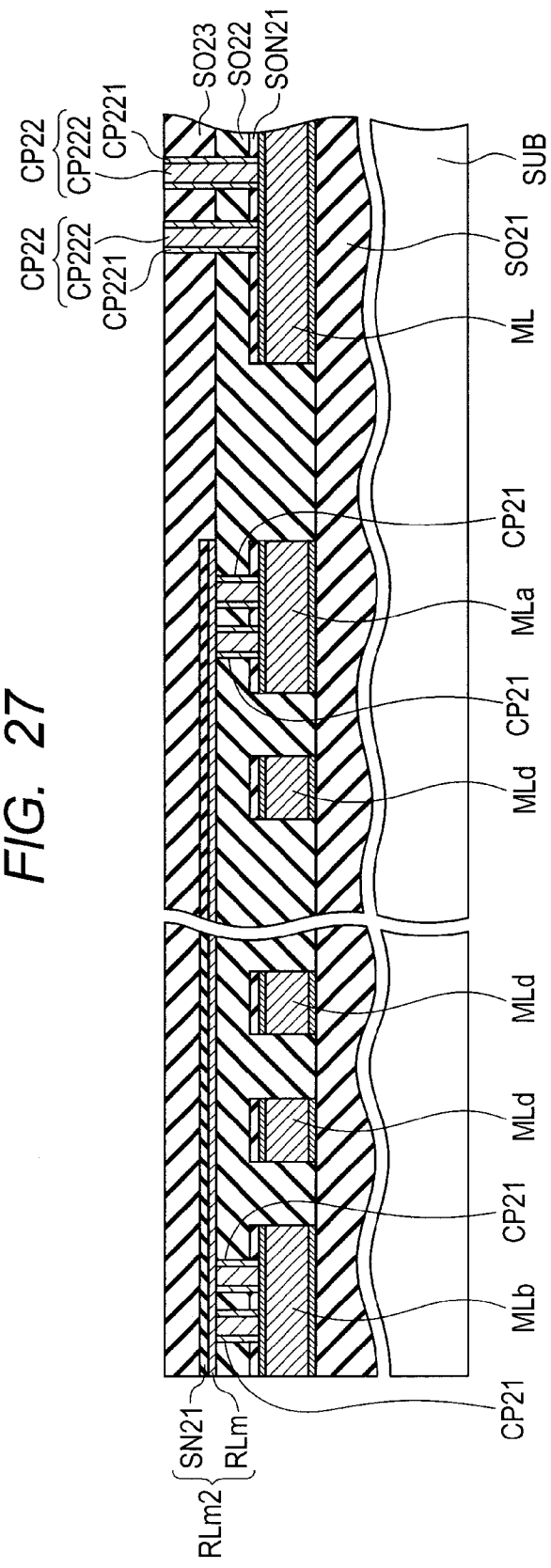
FIG. 27 is a schematic cross-sectional view illustrating a tenth step of the manufacturing method of the semiconductor device of Embodiment 2 of the invention.

Next, as illustrated in FIG. 27, a contact plug CP22 is formed in the contact hole Vh1. Described specifically, a TiN/Ti film stack CP221 is formed as a barrier metal in the contact hole Vh1 by sputtering and then a tungsten (W) film CP222 is deposited by CVD. The upper surfaces of the TiN/Ti film stack CP221 and the tungsten (W) film CP222 are then planarized by CMP.

Figure 28:
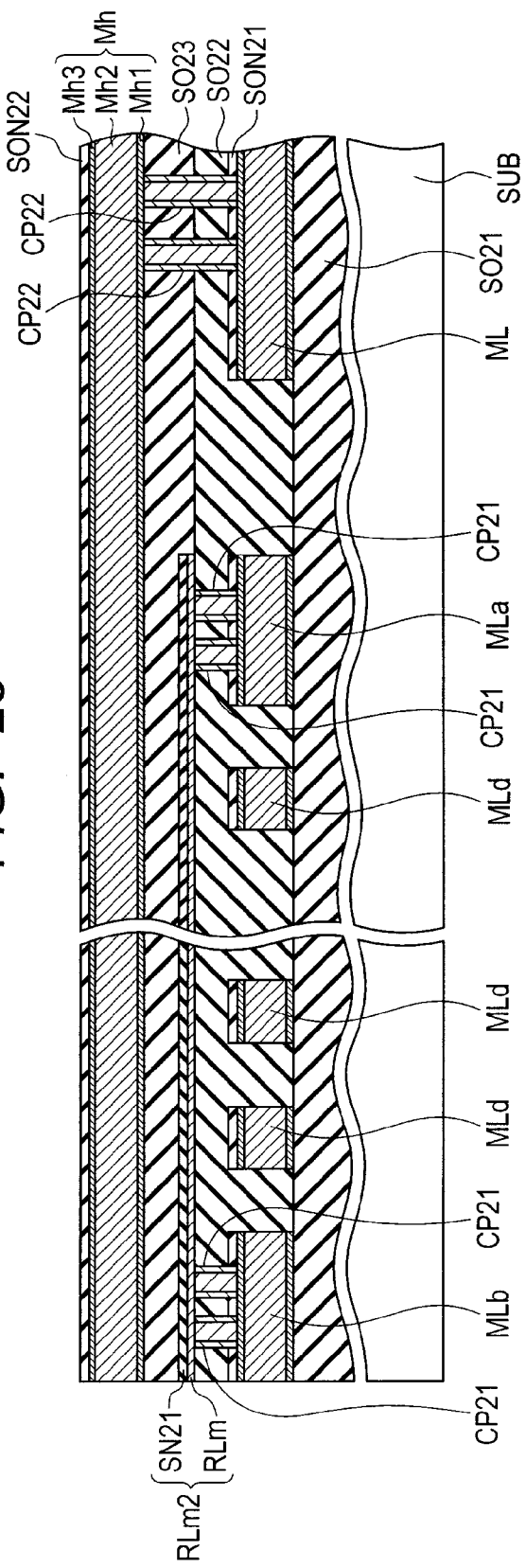
FIG. 28 is a schematic cross-sectional view illustrating an eleventh step of the manufacturing method of the semiconductor device of Embodiment 2 of the invention.

Next, as illustrated in FIG. 28, an upper-level interconnect layer Mh is formed over the third interlayer insulating film SO23. The upper-level interconnect layer Mh is an upper-level aluminum interconnect and is formed using sputtering. The upper-level interconnect layer Mh has a stack structure having a TiN/Ti film as a bottom layer Mh1, a copper-added aluminum (Al—Cu) film as an interconnect body Mh2, and a TiN/Ti film as a top layer Mh3. The upper-level interconnect layer Mh has a thickness of from about 300 nm to 400 nm when it is not the uppermost-level interconnect layer and, has a film thickness of from about several hundred nm to 1 μam when it is the uppermost level interconnect layer.

Figure 29:
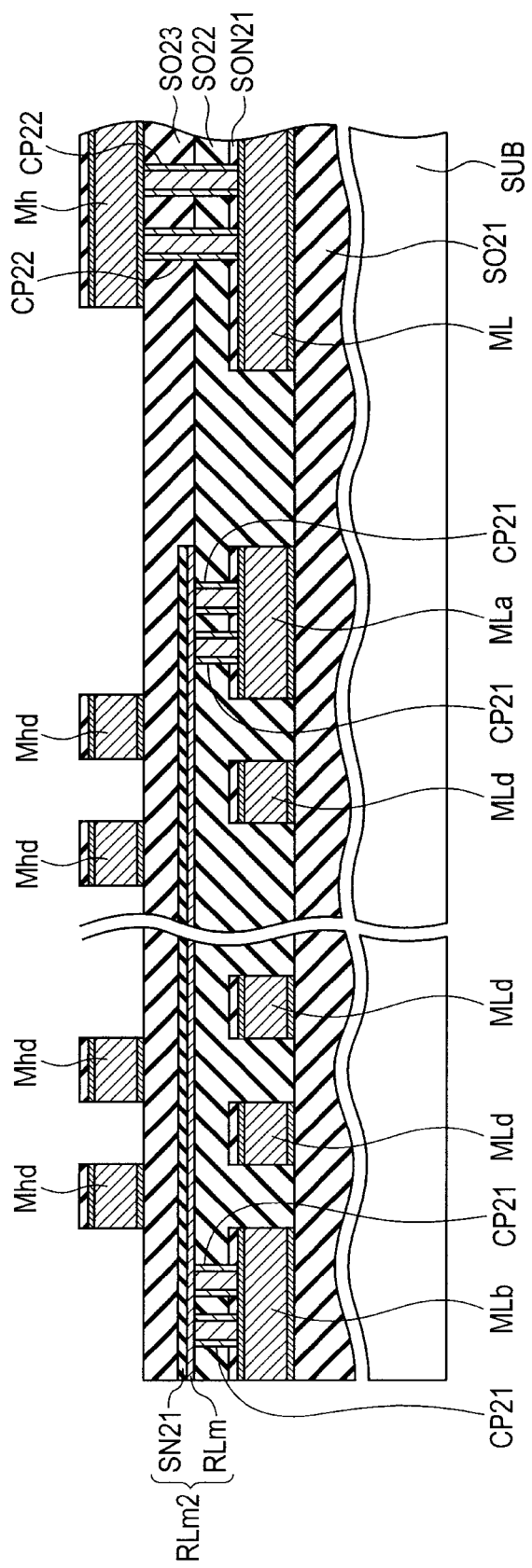
FIG. 29 is a schematic cross-sectional view illustrating a twelfth step of the manufacturing method of the semiconductor device of Embodiment 2 of the invention.

Next, an antireflective film SON22 is formed over the upper-level interconnect layer Mh. As the antireflective film SON22, a plasma oxynitride film (P-SiON) is formed using CVD. Next as illustrated in FIG. 29, the upper-level interconnect layer Mh and the antireflective film SON22 are patterned. Photolithography and dry etching are used for patterning. They are patterned into a plurality of second dummy layers Mhd arranged to have a predetermined space between any adjacent two thereof in the first direction (direction X) and extending in the second direction (direction Y) perpendicular to the first direction (direction X) and the upper-level interconnect layer Mh having a predetermined shape.

The patterning is performed so that with regard to the plurality of first dummy layers MLd and the plurality of second dummy layers Mhd, the second dummy layer Mhd be placed between two adjacent first dummy layers MLd in a planar view. For example, diffusion of hydrogen from the interconnect interlayer film into a MOS transistor or the like, which is on the substrate side and lies below the interlayer film, may deteriorate the characteristics of the element. However, alternate arrangement of the first dummy layer MLd and the second dummy layer Mhd in a planar view is expected to prevent downward penetration of hydrogen and thereby overcome such a problem.

The semiconductor device illustrated in FIGS. 16 and 17 is completed through the steps described above. Also in the semiconductor device of the present embodiment, description is made using TiN, a refractory metal, as one example of a material of the metal interconnect layer RLm, but the material is not limited thereto. As a metal material for the resistor, materials having a temperature coefficient of resistance as small as possible are desired. Another material such as tantalum nitride (TaN) can also be used instead of titanium nitride (TiN).

According to the semiconductor device and manufacturing method thereof in the present embodiment, a metal resistor layer RLm is formed in a region between the intermediate interconnect layer ML and the upper-level interconnect layer Mh in the semiconductor device. This enables to realize a high-precision resistor with small variations in resistance due to mold stress in and after a packaging step, making it possible to form a high-precision analog circuit. Incidentally, the specific configuration of an oscillator circuit using the metal resistor layer RLm described above is similar to the oscillator circuit illustrated in FIG. 15.

Embodiment 3

In the next place, referring to FIGS. 30 and 31, a partial structure of a high-speed OCO circuit will be described as one example of a semiconductor device. The entire structure of the microcomputer chip is the same as that of FIG. 1. FIG. 31 illustrates the cross-section taken in the direction of arrows along the XXXI-XXXI line in FIG. 30.

As illustrated in FIG. 31, this semiconductor device has a first interlayer insulating film SO21 provided above a substrate SUB and a plurality of first dummy layers MLd provided above the first interlayer insulating film SO21, arranged to have a predetermined space between any two adjacent layers thereof in a first direction (direction X in FIG. 30), and extending in a second direction (direction Y in FIG. 30) perpendicular to the first direction (direction X).

The first interlayer insulating film SO21 has thereover a lower-level interconnect layer ML formed in the same step as that of forming the first dummy layers MLd.

The plurality of first dummy layers MLd and the lower-level interconnect layer ML are covered with a second interlayer insulating film SO22 having a planarized surface. The second interlayer insulating film SO22 has thereover a metal resistor layer RLm2 extending in the first direction (direction X). The metal resistor layer RLm2 has a two-layer structure composed of a metal interconnect layer RLm and an antioxidant film layer SN21.

Figure 30:
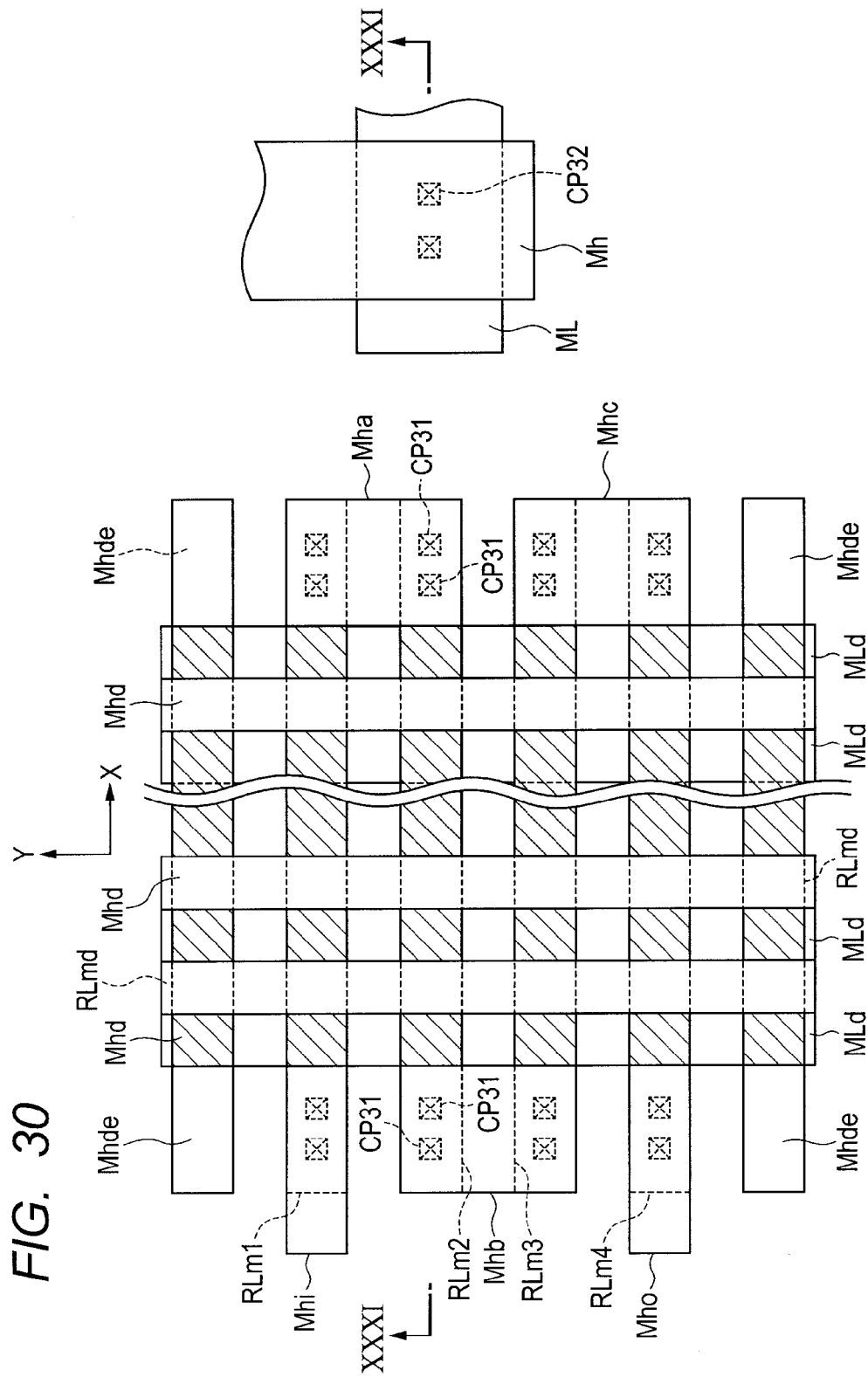
FIG. 30 illustrates the planar structure of a semiconductor device according to Embodiment 3 of the invention.
Figure 31:
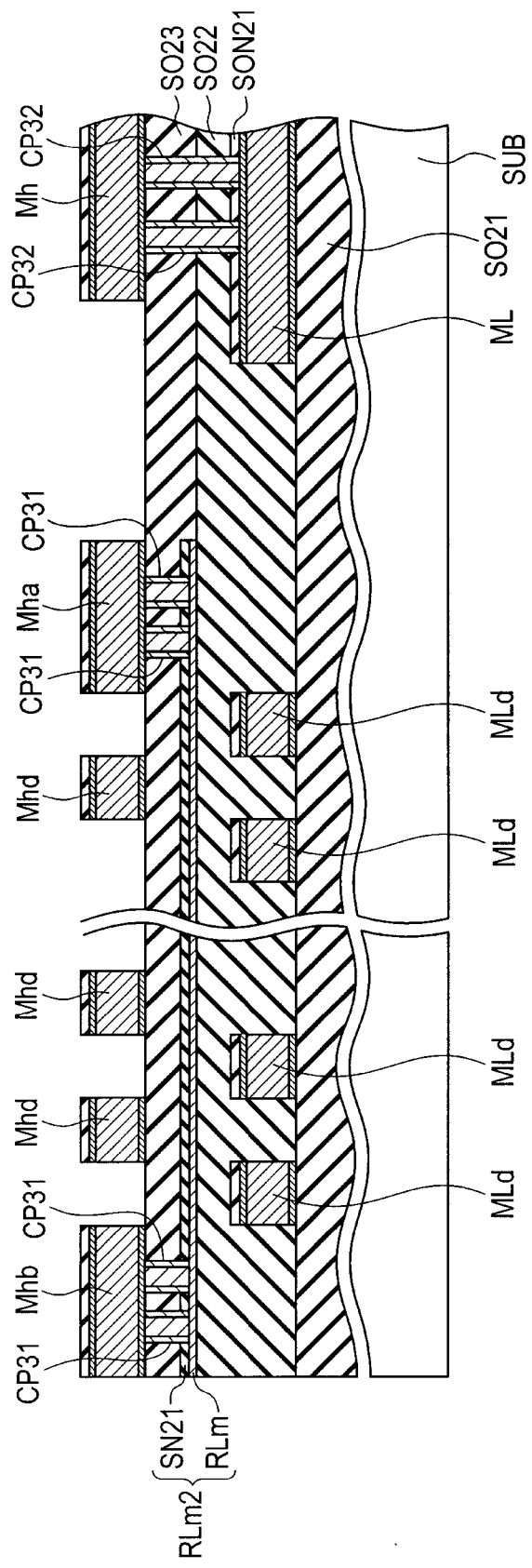
FIG. 31 is a cross-sectional view taken in the direction of arrows along the line XXXI-XXXI in FIG. 30.

In a planar view illustrated in FIG. 30, the metal resistor layers RLm1 to RLm4 extend in the first direction (direction X) and arranged to have a predetermined space between any adjacent two thereof in the second direction (direction Y).

The metal resistor layers RLm1 and RLm4 have, on the respective outsides thereof, a dummy metal resistor layer RLmd from the standpoint of improving the manufacturing precision in photolithography.

As illustrated in FIG. 31, the metal resistor layer RLm2 is covered with a third interlayer insulating film SO23 having a flat surface. The third interlayer insulating film SO23 has thereover a plurality of second dummy layers Mhd arranged to have a predetermined space between any adjacent two thereof in a first direction (direction X in FIG. 30) and extending in a second direction (direction Y in FIG. 30) perpendicular to the first direction (direction X).

The plurality of first dummy layer MLd and the plurality of second dummy layers Mhd are placed so that each of the second dummy layers Mhd be placed between two adjacent first dummy layers MLd in a planar view. The plurality of first dummy layers MLd and the plurality of second dummy layers Mhd are grounded and used as a GND line.

The third interlayer insulating film SO23 has thereover tap layers Mha and Mhb arranged with a predetermined space therebetween in the second direction (direction Y) at a position sandwiching the plurality of second dummy layers Mhd from both sides thereof in the first direction (direction X). In a planar view illustrated in FIG. 30, tap layers Mhi, Mha to Mhc, and Mho are provided. In addition, dummy tap layers Mhde are provided from the standpoint of improving the manufacturing precision in photolithography.

The metal resistor layers RLm1 to RLm4 have, at both ends thereof, a contact plug CP31 penetrating through the third interlayer insulating film SO23 and linked to the tap layers Mhi, Mha to Mhc, and Mho.

As a result, the metal resistor layers RLm1 to RLm4 are electrically coupled in series in the following manner: tap layer Mhi→contact plug CP31→metal resistor layer RLm1→contact plug CP31→tap layer Mha→contact plug CP31→metal resistor layer RLm2→contact plug CP31→tap layer Mhb→contact plug CP31→metal resistor layer RLm3→contact plug CP31→tap layer Mhc→contact plug CP31→metal resistor layer RLm4→contact plug CP31→tap layer Mho.

In addition, the third interlayer insulating film SO23 has thereover an upper-level interconnect layer Mh formed in the same step as that of forming the second dummy layers Mhd. The lower-level interconnect layer ML and the upper-level interconnect layer Mh are electrically coupled to each other via a contact plug CP32 penetrating through the second interlayer insulating film SO22 and the third interlayer insulating film SO23.

According to the configuration of the present embodiment, a metal resistor layer RLm is formed in an interlayer film of an intermediate layer of a multilayer aluminum interconnect structure so that a known multi-layer interconnect structure is employed for layers below the first interlayer insulating film SO21 and layers over the third interlayer insulating film SO23.

(Manufacturing method) Referring to FIGS. 32 to 41, a manufacturing method of the semiconductor device illustrated in FIGS. 30 and 31 will next be described. Each step of the manufacturing method described below corresponds to the cross-section taken in the direction of arrows along the XXXI-XXXI line in FIG. 30.

Figure 32:
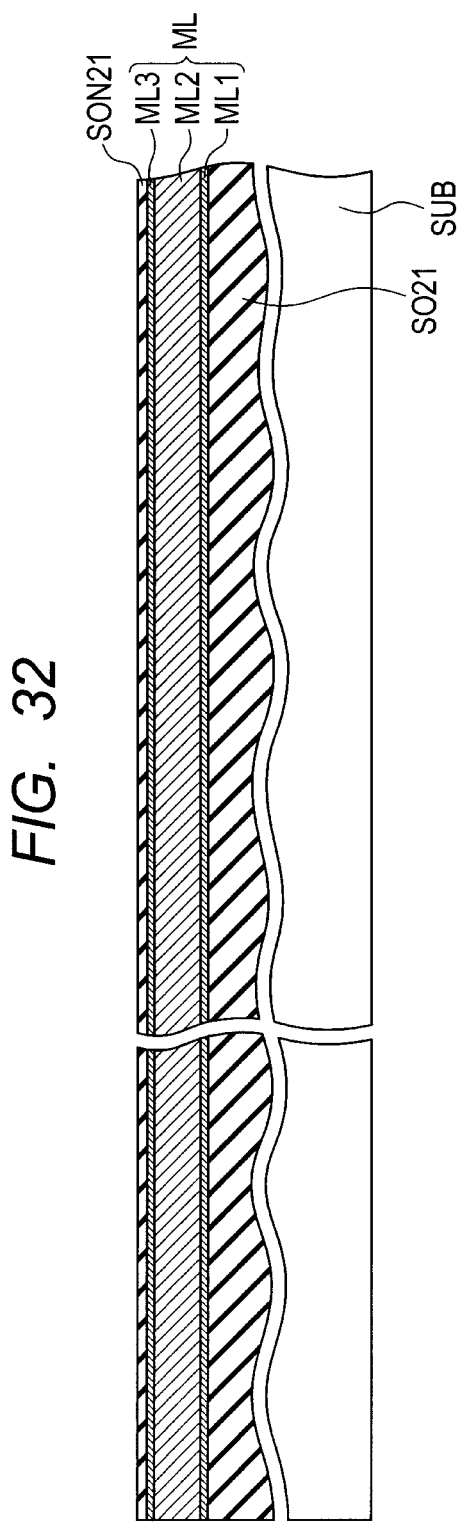
FIG. 32 is a schematic cross-sectional view illustrating a first step of a manufacturing method of the semiconductor device of Embodiment 3 of the invention.

As illustrated in FIG. 32, after formation of a known multilayer interconnect structure over a substrate SUB, a first interlayer insulating film SO21 having a planarized surface is formed. As the first interlayer insulating film SO21, a silicon oxide film made of HDP-USG and P-TEOS is used.

Incidentally, the substrate SUB may be a semiconductor substrate having a semiconductor element integrated therein or a substrate made of a material other than semiconductor.

Next, an intermediate interconnect layer ML is formed over the first interlayer insulating film SO21. The interconnect layer ML is an intermediate aluminum interconnect and is formed using sputtering. The interconnect layer ML has a film stack structure having a TiN/Ti film as a bottom layer ML1, a copper-added aluminum (Al—Cu) film as an interconnect body ML2, and a TiN/Ti film as a top layer ML3. The interconnect layer ML has a thickness of from about 300 nm to 400 nm.

Next, an antireflective film SON21 is formed over the intermediate interconnect layer ML. As the antireflective film SON21, a plasma oxynitride film (P-SiON) is formed using CVD.

Figure 33:
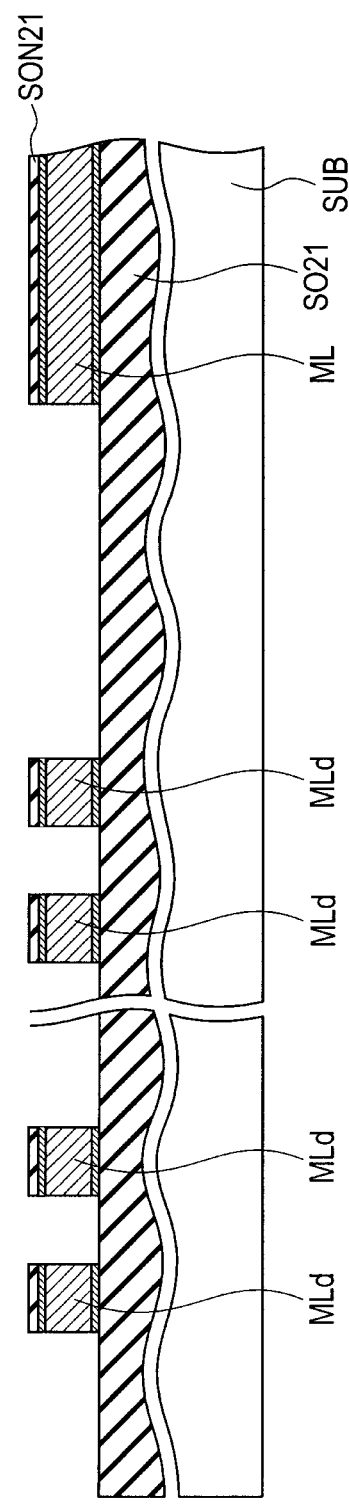
FIG. 33 is a schematic cross-sectional view illustrating a second step of the manufacturing method of the semiconductor device of Embodiment 3 of the invention.

Next, as illustrated in FIG. 33, the intermediate interconnect layer ML and the antireflective film SON21 are patterned. For patterning, photolithography and dry etching are employed. They are patterned into a plurality of dummy layers MLd arranged to have a predetermined space therebetween in the first direction (direction X) and extending in the second direction (direction Y) perpendicular to the first direction (direction X) and an intermediate interconnect layer ML of a predetermined shape.

Figure 34:
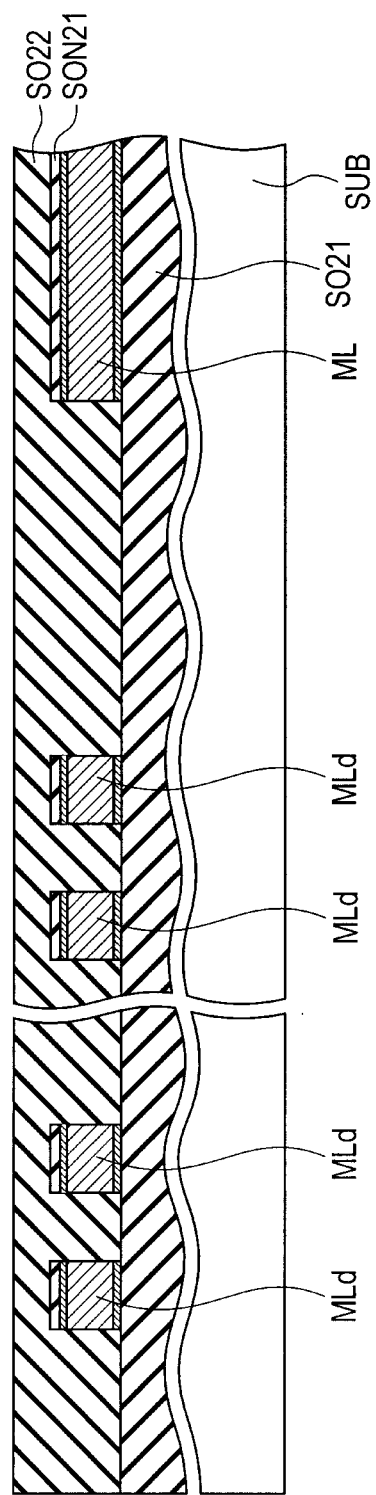
FIG. 34 is a schematic cross-sectional view illustrating a third step of the manufacturing method of the semiconductor device of Embodiment 3 of the invention.

Next, as illustrated in FIG. 34, a second interlayer insulating film SO22 covering therewith the dummy layers MLd and the intermediate interconnect layer ML are formed. As the second interlayer insulating film SO22, a silicon oxide film made of HDP-USG and P-TEOS is used. The surface of the silicon oxide film is planarized using CMP.

The HDP-USG film used herein is required to have a thickness of 500 nm or greater in order to cover the step difference of the aluminum interconnect and a polishing amount required for planarization is about 1.5 times the step difference. The dummy layers MLd are placed with the same interval, for example, with a line width of about 3 μm and a space of about 3 μm, in order to improve the planarity of a metal resistor layer RLm which will be formed later.

Figure 35:
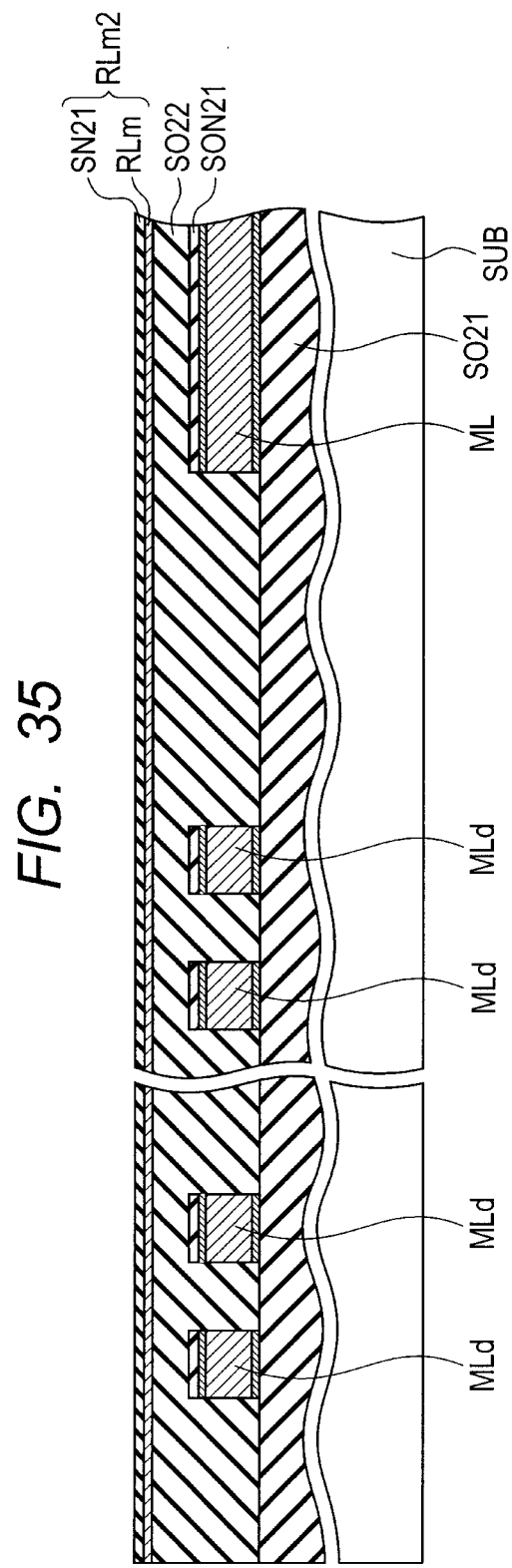
FIG. 35 is a schematic cross-sectional view illustrating a fourth step of the manufacturing method of the semiconductor device of Embodiment 3 of the invention.

Next, as illustrated in FIG. 35, a metal resistor layer RLm2 is formed over the second interlayer insulating film SO22. The metal resistor layer RLm2 has a two-layer structure having a metal interconnect layer RLm and an antioxidant film layer SN21. As the metal interconnect layer RLm, a TiN film is formed as one example of a refractory metal by using sputtering. It is formed with a thickness of about 30 nm in order to have a resistance of about 40Ω/□ as a resistor.

As the antioxidant film layer SN21, a plasma nitride (P-SiN) film is used and it is formed using CVD. It has a film thickness of, for example, about 45 mm.

Figure 36:
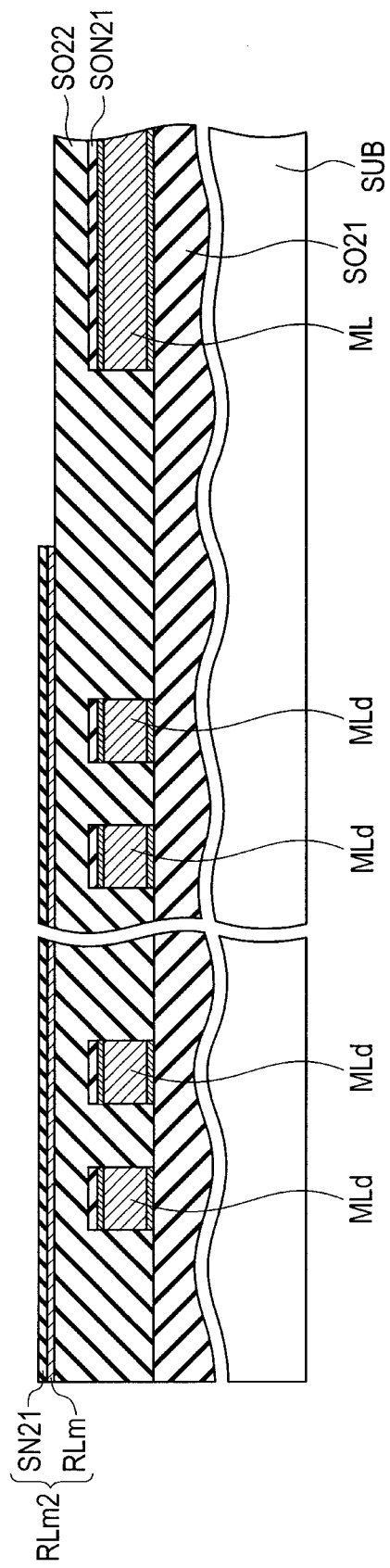
FIG. 36 is a schematic cross-sectional view illustrating a fifth step of the manufacturing method of the semiconductor device of Embodiment 3 of the invention.

Next, as illustrated in FIG. 36, the metal resistor layer RLm2 is patterned using photolithography and dry etching.

By this step, as illustrated in the plan view of FIG. 30, patterning is performed to obtain metal resistor layers RLm1 to RLm4 (including dummy metal resistor layer RLmd) in the form of stripes.

The width of the metal resistor layer RLm is adjusted to about 0.8 μm in the present embodiment to satisfy the demand for improving the processing size stability and for reducing the layout area. In addition, the pattern-pattern width (distance of the resistors) is about 0.6 μm.

The antioxidant film layer SN21 prevents the surface of the metal resistor layer RLm2 from being exposed to an oxidizing atmosphere when a resist is removed in an oxygen plasma atmosphere.

Figure 37:
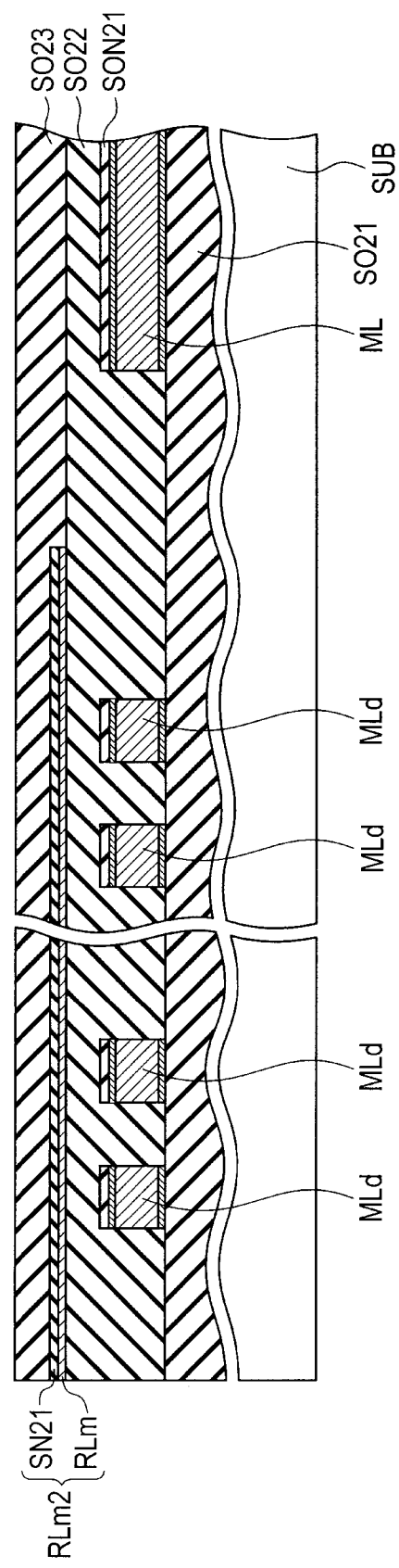
FIG. 37 is a schematic cross-sectional view illustrating a sixth step of the manufacturing method of the semiconductor device of Embodiment 3 of the invention.

Next, as illustrated in FIG. 37, a third interlayer insulating film SO23 is formed over the second interlayer insulating film SO22 to cover the metal resistor layer RLm2. As the third interlayer insulating film SO23, a silicon oxide film made of a P-TEOS film is used and it is formed using CVD.

Figure 38:
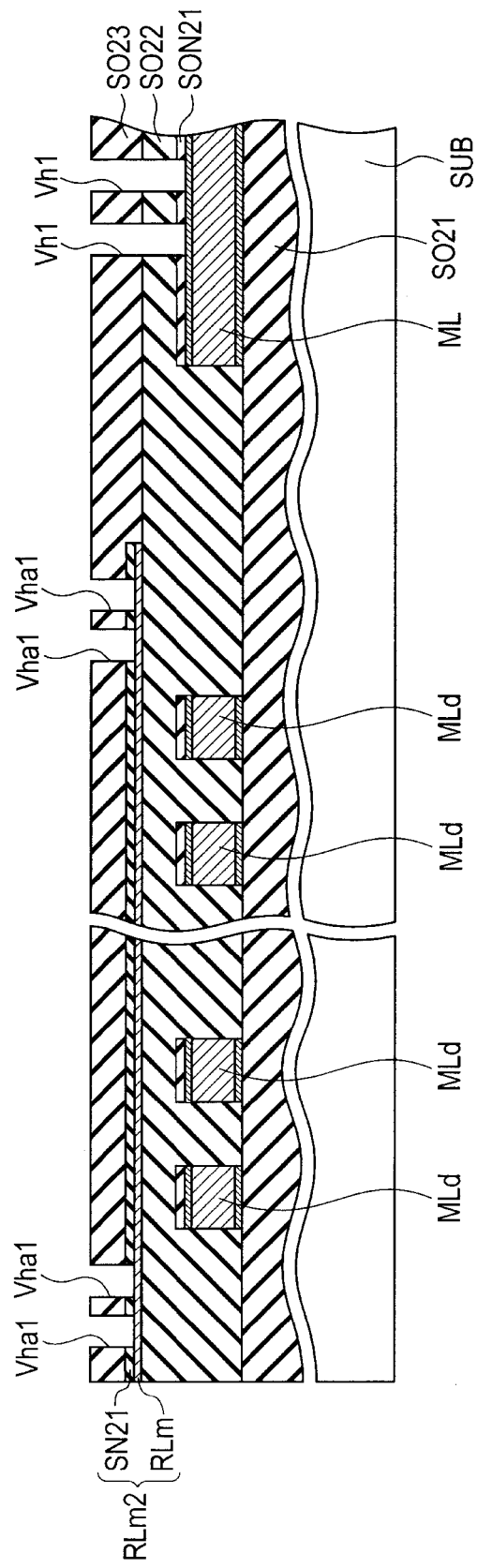
FIG. 38 is a schematic cross-sectional view illustrating a seventh step of the manufacturing method of the semiconductor device of Embodiment 3 of the invention.

Next, as illustrated in FIG. 38, photolithography and dry etching are performed to simultaneously form, in the second interlayer insulating film SO22, a contact hole Vha1 linked to the metal interconnect layer RLm and, in the second interlayer insulating film SO22 and the third interlayer insulating film SO23, a contact hole Vh1 communicating with the intermediate interconnect layer ML. The contact hole Vha1 and the contact hole Vh1 are each provided preferably at two or more positions to secure stability of contact resistance.

Incidentally, the contact hole Vha1 and the contact hole Vh1 are different from each other in etching depth, but they can be opened simultaneously because the antioxidant film layer SN21 using a plasma nitride (P-SiN) film and the plasma oxynitride film (P-SiON) SON22 act as an etching stopper.

Figure 39:
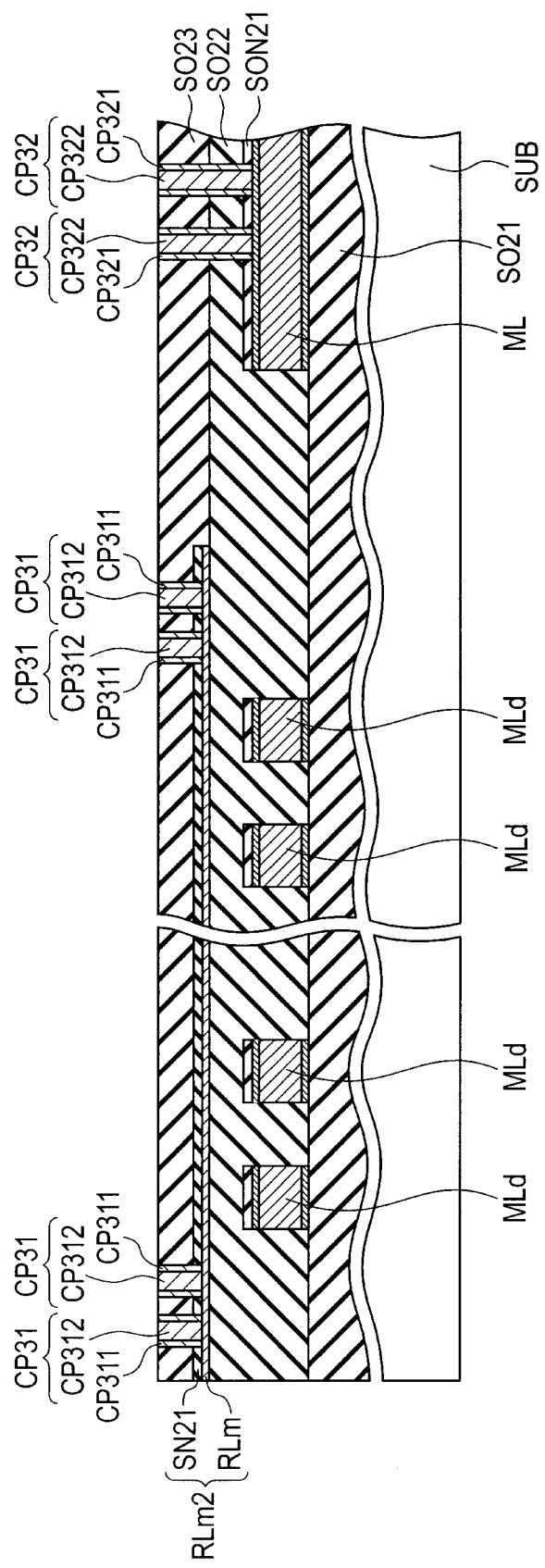
FIG. 39 is a schematic cross-sectional view illustrating an eighth step of the manufacturing method of the semiconductor device of Embodiment 3 of the invention.

Next, as illustrated in FIG. 39, formation of a contact plug CP31 in the contact hole Vha1 and formation of a contact plug CP32 in the contact hole Vh1 are performed simultaneously. In the contact holes Vha1 and Vh1, TiN/Ti film stacks CP311 and CP321 are formed simultaneously as a barrier metal by sputtering.

Next, tungsten (W) films CP312 and CP322 are simultaneously formed in the contact holes Vha1 and Vh1, respectively, by CVD. Then, the upper surfaces of the TiN/Ti film stacks CP311 and CP321 and the tungsten (W) films CP312 and CP322 are planarized by CMP.

Figure 40:
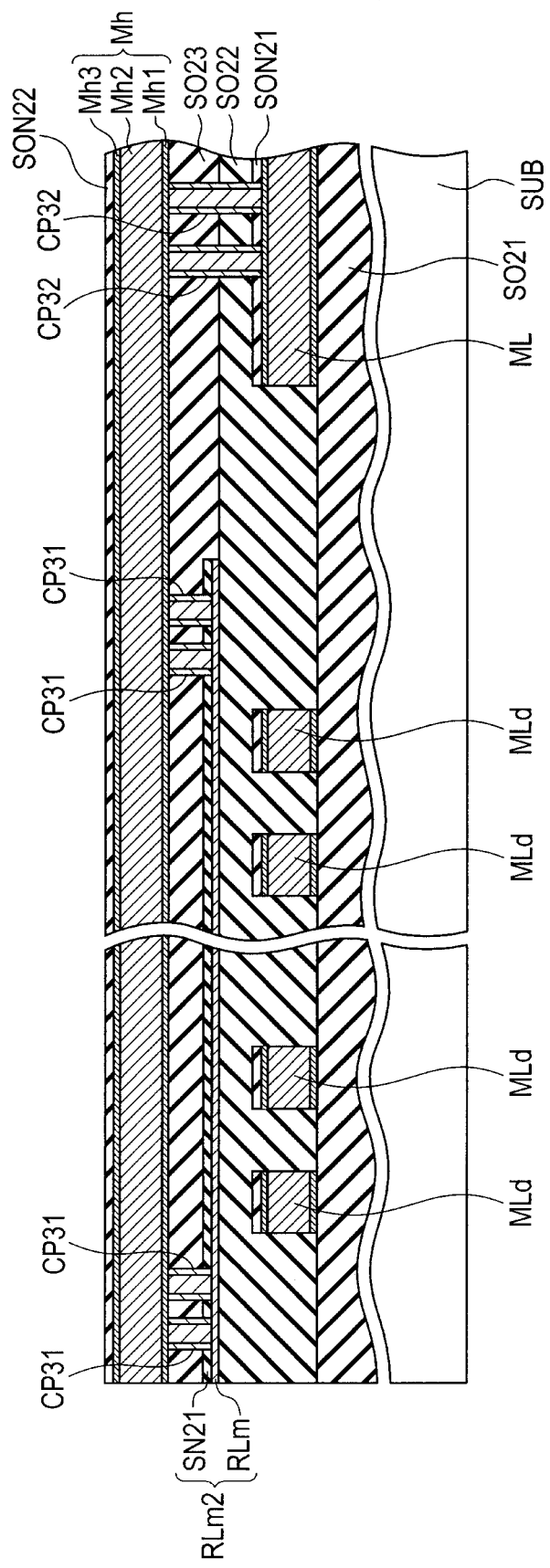
FIG. 40 is a schematic cross-sectional view illustrating a ninth step of the manufacturing method of the semiconductor device of Embodiment 4 of the invention.

Next, as illustrated in FIG. 40, an upper-level interconnect layer Mh is formed over the third interlayer insulating film SO23. The upper-level interconnect layer Mh is an upper-level aluminum interconnect and is formed using sputtering. The upper-level interconnect layer Mh has a film stack structure having a TiN/Ti film as a bottom layer Mh1, a copper-added aluminum (Al—Cu) film as an interconnect body Mh2, and a TiN/Ti film as a top layer Mh3. The upper-level interconnect layer Mh has a thickness of from about 300 nm to 400 nm when Mh is not the uppermost level interconnect layer, and has a thickness of from several hundred nm to 1 μm when Mh is the uppermost level interconnect layer.

Next, an antireflective film SON22 is formed over the upper-level interconnect layer Mh. As the antireflective film SON22, a plasma oxynitride film (P-SiON) is formed using CVD.

Figure 41:
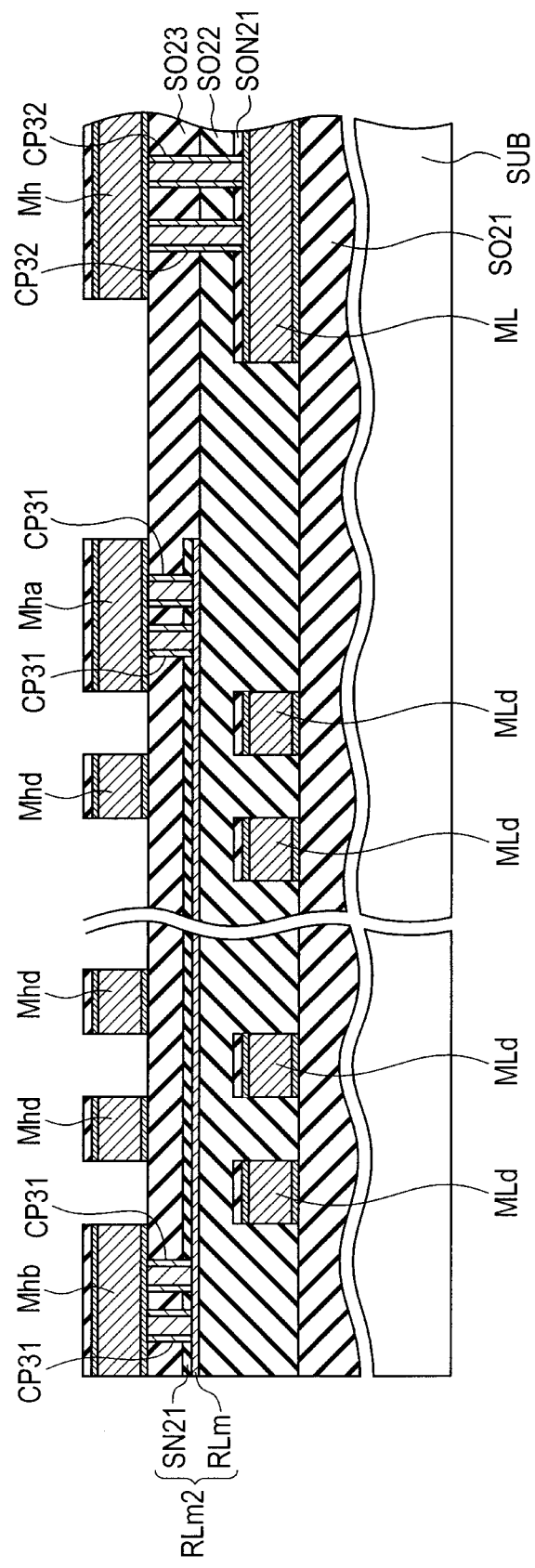
FIG. 41 is a schematic cross-sectional view illustrating a tenth step of the manufacturing method of the semiconductor device of Embodiment 3 of the invention.

Next, as illustrated in FIG. 41, the upper-level interconnect layer Mh and the antireflective film SON22 are patterned. For this patterning, photolithography and dry etching are employed. They are patterned into a plurality of second dummy layers Mhd arranged to have a predetermined space between any adjacent two thereof in a first direction (direction X) and extending in a second direction (direction Y) perpendicular to the first direction (direction X), tap layers Mha and Mhb placed at a position sandwiching the plurality of dummy layers Mhd from both sides thereof in the first direction (direction X), and an upper-level interconnect layer Mh of a predetermined shape.

As a result, the metal resistor layers RLm1 to RLm4 are electrically coupled to the tap layers Mhi, Mha, Mhb, Mhc, and Mho via the contact plug CP31, whereby they are coupled in series.

The number of unit resistors linked in series and the length of the unit resistors are determined, depending on a required resistance value. When the length of the unit resistor is extremely short, however, the influence of the tap layers in the total resistance becomes too large, resulting in deterioration in resistance accuracy. Accordingly, the length of the metal resistor layer (unit resistor) is controlled to preferably about 40 μm or greater.

The plurality of first dummy layers MLd and the plurality of second dummy layers Mhd are patterned so that in a planar view, the second dummy layer Mhd be placed between two adjacent first dummy layers MLd. For example, diffusion of hydrogen from the interconnect interlayer film into a MOS transistor or the like, which lies below the interlayer film and is on the side of the substrate, may deteriorate the characteristics of the element. However, alternate placement of the first dummy layer MLd and the second dummy layer Mhd in a planar view is expected to prevent downward penetration of hydrogen and thereby overcome such a problem.

The semiconductor device illustrated in FIGS. 30 and 31 is completed through the steps described above. Also in the semiconductor device of the present embodiment, description is made using TiN, a refractory metal, as one example of a material of the metal interconnect layer RLm, but the material is not limited thereto. As a metal material for resistor, materials having as small a temperature coefficient of resistance (TCR) as possible are desired. Another material such as tantalum nitride (TaN) can also be used instead of titanium nitride (TiN).

According to the semiconductor device and manufacturing method thereof in the present embodiment, the metal resistor layer RLm is formed in a region between the intermediate interconnect layer ML and the upper-level interconnect layer Mh in the semiconductor device. This enables to realize a high-precision resistor with small variations in resistance due to mold stress in and after a packaging step, making it possible to form a high-precision analog circuit.

In addition, since the tap layers Mhi, Mha, Mhb, Mhc, and Mho are formed over the third interlayer insulating film SO23, the contact plug CP31 can be formed simultaneously with the contact plug CP32. This enables to simplify the process flow. An improvement in yield of the product can also be expected. A specific configuration of an oscillator circuit using the above metal resistor layer RLm is similar to the oscillator circuit illustrated in FIG. 15.

Figure 42A:
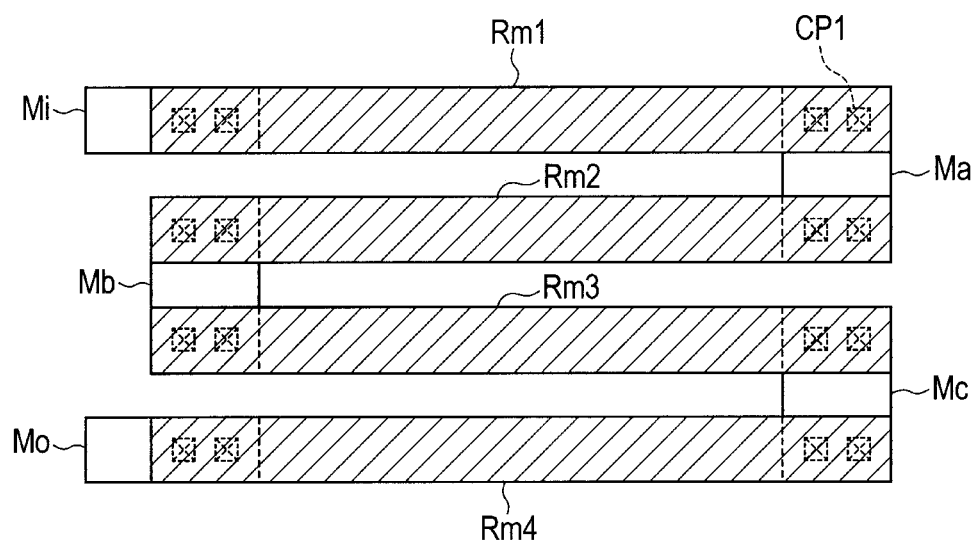
Figure 42B:
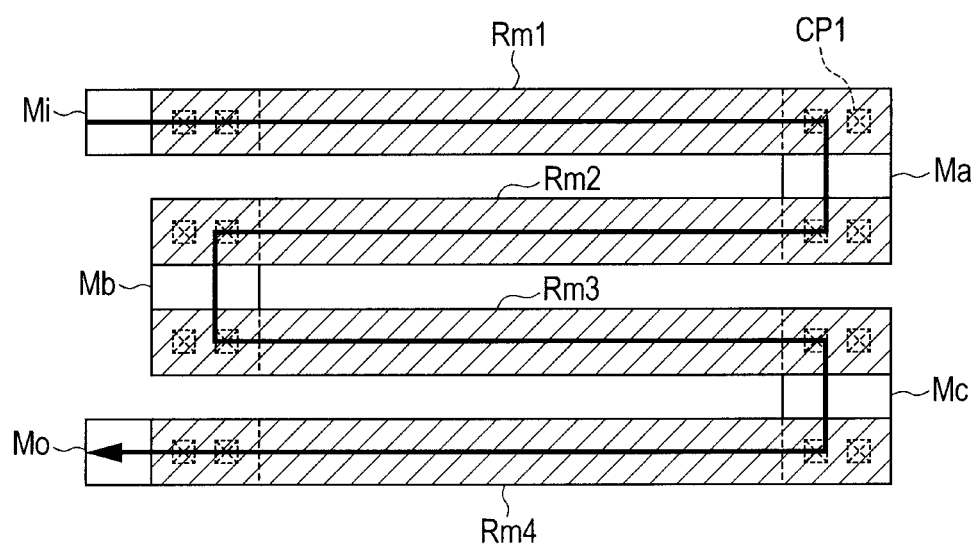

(Another arrangement of metal resistor layer) In the above embodiments, as illustrated in FIG. 42, the metal resistor layers are coupled in series by electrically coupling the end portions, which have been arranged in parallel to each other, alternately. FIG. 42A schematically illustrates the arrangement of the metal resistor layers according to Embodiment 1. As a result, as illustrated in FIG. 42B, a current flows in a zigzag manner in a planar view. Arrangement and coupling manner of the metal resistor layers are not limited thereto.

Figure 43A:
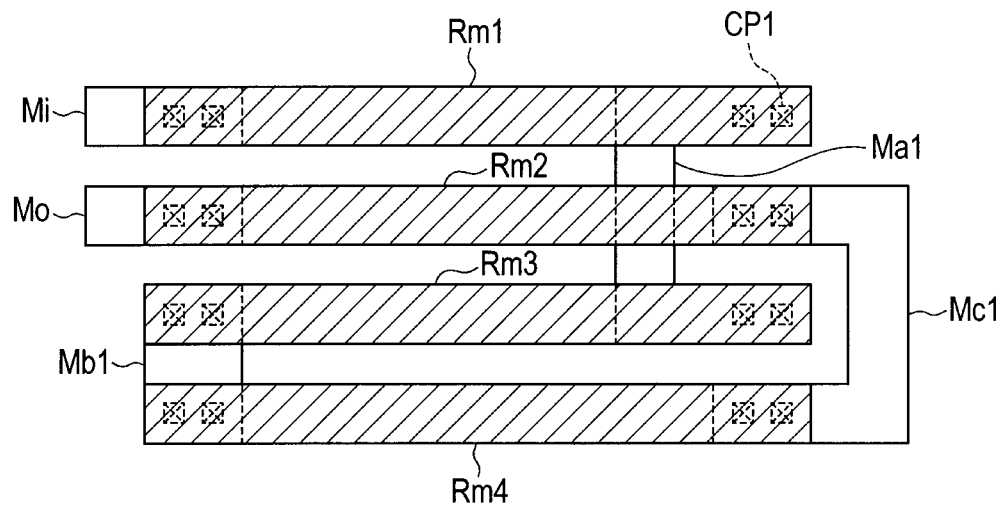

For example, as illustrated in FIG. 43A, it is possible to employ a series-coupled structure in which with regards to the metal resistor layer Rm1 to Rm4 arranged in parallel to each other, the metal resistor layer Rm1 and the metal resistor layer Rm3 are coupled using the tap layer Mal; the metal resistor layer Rm2 and the metal resistor layer Rm4 are coupled using the tap layer Mc1; and the metal resistor layer Rm3 and the metal resistor layer Rm4 are coupled using the tap layer Mb1.

Figure 43B:
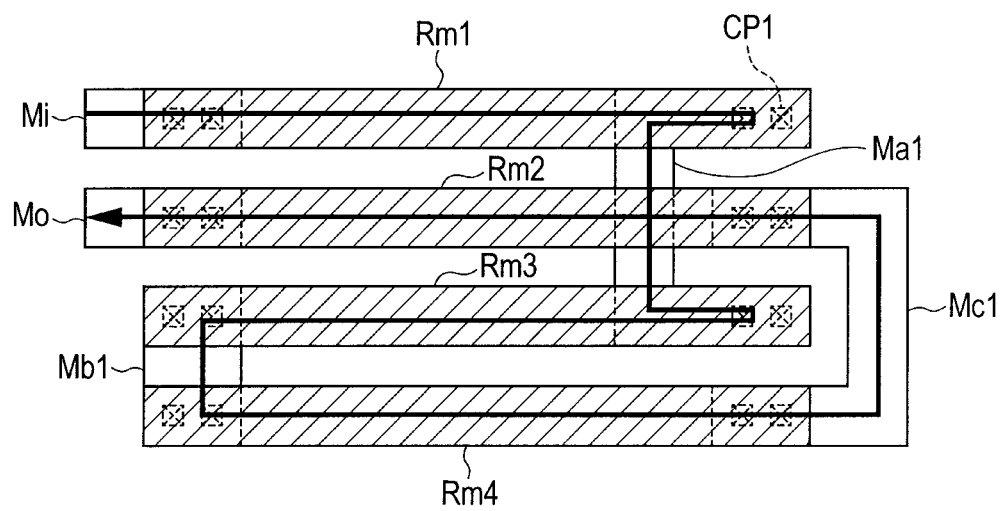

More specifically, they are electrically coupled in series in the following manner: tap layer Mi→contact plug CP1→metal resistor layer Rm1→contact plug CP1→tap layer Mal→contact plug CP1→metal resistor layer Rm3→contact plug CP1→tap layer Mb1→contact plug CP1→metal resistor layer Rm4→contact plug CP1→tap layer Mc1→contact plug CP1→metal resistor layer Rm2→contact plug CP1→tap layer Mo. In this case, the current flows as illustrated in FIG. 43B in a planar view.

Embodiments disclosed herein are meant to be exemplary only but not limiting. The scope of the present invention is given not by the above description but by claims. The invention intends to cover all the modifications having the equal meaning to the claims or within the claims.

The present invention can be applied particularly advantageously to a semiconductor device having a metal resistor layer and a manufacturing method of the device.

The invention claimed is:

1. A semiconductor device comprising:
    a first interlayer insulating film placed over a substrate;
    a plurality of first dummy layers placed over the first interlayer insulating film, arranged to have a predetermined space between any adjacent two thereof in a first direction, and extending in a second direction perpendicular to the first direction in a planar view;
    an uppermost level interconnect layer placed over the first interlayer insulating film;
    a second interlayer insulating film covering therewith the first dummy layers and the uppermost level interconnect layer, and having a planarized surface;
    a plurality of metal resistor layers placed over the second interlayer insulating film and extending in the first direction in a planar view; and
    a third interlayer insulating film covering therewith the metal resistor layers;
    a passivation film placed over the third interlayer insulating film;
    a plurality of tap layers formed on the first interlayer insulating film; and
    a plurality of contact plugs formed in the second interlayer insulating film, more than one contact plugs connecting corresponding one of the plurality of tap layers and the plurality of metal resistor layers, the more than one contact plugs being connected to a same surface of the corresponding one of the plurality of tap layers, wherein
    the plurality of metal resistor layers are formed in a region between the passivation film and the uppermost level interconnect layer.

2. The semiconductor device according to claim 1, wherein the first dummy layers are formed in the same manufacturing step as that of an uppermost level interconnect layer of the semiconductor device.

3. The semiconductor device according to claim 1, wherein the metal resistor layer has a two-layer structure having a metal interconnect layer and an antioxidant film layer.

4. The semiconductor device according to claim 1, wherein the passivation film has a flat surface.

5. The semiconductor device according to claim 1, wherein
    the plurality of tap layers are placed over the first interlayer insulating film, arranged at a position sandwiching the first dummy layers from both sides thereof in the first direction in a planar view, and arranged with a predetermined space in the second direction,
    the metal resistor layers extend in the first direction and arranged to have a predetermined space between any adjacent two thereof in the second direction, and
    the metal resistor layers are electrically coupled to the tap layers via a contact plug penetrating through the second interlayer insulating film so as to form series connection.

6. The semiconductor device according to claim 1, further comprising a plurality of pad opening portions from which a surface of the uppermost level interconnect layer is exposed,
    wherein a distance from an opening end face of the second interlayer insulating film and the third interlayer insulating film above the pad opening portions to the metal resistor layers is 100 μm or greater.

7. The semiconductor device according to claim 6, wherein the distance is 100 μm.

* * * * *